(12) United States Patent
Takaya et al.

(10) Patent No.: US 7,470,953 B2
(45) Date of Patent: Dec. 30, 2008

(54) INSULATED GATE TYPE SEMICONDUCTOR DEVICE AND MANUFACTURING METHOD THEREOF

(75) Inventors: Hidefumi Takaya, Aichi-ken (JP); Kimimori Hamada, Toyota (JP); Akira Kuroyanagi, Okazaki (JP); Yasushi Okura, Toyokawa (JP); Norihito Tokura, Okazaki (JP)

(73) Assignees: Toyota Jidosha Kabushiki Kaisha, Toyota-shi (JP); Denso Corporation, Kariya-shi (JP)

( * ) Notice: Subject to any disclaimer, the term of this patent is extended or adjusted under 35 U.S.C. 154(b) by 221 days.

(21) Appl. No.: 10/573,793

(22) PCT Filed: Oct. 6, 2004

(86) PCT No.: PCT/JP2004/015179

§ 371 (c)(1),
(2), (4) Date: Sep. 12, 2006

(87) PCT Pub. No.: WO2005/036650

PCT Pub. Date: Apr. 21, 2005

(65) Prior Publication Data

US 2006/0289928 A1 Dec. 28, 2006

(30) Foreign Application Priority Data

Oct. 8, 2003 (JP) ............................. 2003-349806
Nov. 5, 2003 (JP) ............................. 2003-375098

(51) Int. Cl.
*H01L 29/76* (2006.01)
*H01L 21/336* (2006.01)
(52) U.S. Cl. ................. 257/330; 257/332; 257/E27.26; 257/E21.429; 438/270; 438/272

(58) Field of Classification Search ................. 257/329, 257/330, 332, E29.26, E21.429; 438/270, 438/272
See application file for complete search history.

(56) References Cited

U.S. PATENT DOCUMENTS 5,282,018 A 1/1994 Hiraki et al.

(Continued)

FOREIGN PATENT DOCUMENTS

EP 0 345 380 A2 12/1989

(Continued)

OTHER PUBLICATIONS

Takaya, H., et al., Floating Island and Thick Bottom Oxide Trench Gate MOSFET (FITMOS), Proceedings of the 17th International Symposium on Power Semiconductor Devices & IC's, May 23-26, 2005, pp. 43-46.*

(Continued)

*Primary Examiner*—Tuan N. Quach
(74) *Attorney, Agent, or Firm*—Kenyon & Kenyon LLP

(57) ABSTRACT

The invention is intended to present an insulated gate type semiconductor device that can be manufactured easily and its manufacturing method while realizing both higher withstand voltage design and lower on-resistance design. The semiconductor device comprises N+ source region 31, N+ drain region 11, P− body region 41, and N− drift region 12. By excavating part of the upper side of the semiconductor device, a gate trench 21 is formed. The gate trench 21 incorporates the gate electrode 22. A P floating region 51 is provided beneath the gate trench 21. A further trench 35 differing in depth from the gate trench 21 may be formed, a P floating region 54 being provided beneath the trench 25.

20 Claims, 30 Drawing Sheets

U.S. PATENT DOCUMENTS

| | | | |
|---|---|---|---|
| 5,466,616 A * | 11/1995 | Yang | 438/197 |
| 6,037,632 A | 3/2000 | Omura et al. | |
| 6,194,741 B1 | 2/2001 | Kinzer et al. | |
| 6,198,127 B1 | 3/2001 | Kocon | |
| 6,342,709 B1 | 1/2002 | Sugawara et al. | |
| 6,433,385 B1 | 8/2002 | Kocon et al. | |
| 6,465,844 B2 | 10/2002 | Saito et al. | |
| 6,498,368 B2 | 12/2002 | Sakamoto et al. | |
| 6,673,681 B2 | 1/2004 | Kocon et al. | |
| 2001/0000919 A1 | 5/2001 | Kocon | |
| 2003/0160281 A1 | 8/2003 | Chen | |

FOREIGN PATENT DOCUMENTS

| | | |
|---|---|---|
| JP | 4-251983 | 9/1992 |
| JP | 5-082792 | 4/1993 |
| JP | 05-335582 | 12/1993 |
| JP | 06-013621 | 1/1994 |
| JP | 07-083118 | 9/1995 |
| JP | 09-191109 | 7/1997 |
| JP | 10-098188 | 4/1998 |
| JP | 11-068102 | 3/1999 |
| JP | 2000-216381 A | 8/2000 |
| JP | 2000-260984 A | 9/2000 |
| JP | 2000-353805 A | 12/2000 |
| JP | 2001-015744 A | 1/2001 |
| JP | 2001-168327 A | 6/2001 |
| JP | 2001-267570 A | 9/2001 |
| JP | 2002-100772 A | 4/2002 |
| WO | WO 99/52152 | 10/1999 |
| WO | WO 00/70654 | 11/2000 |

OTHER PUBLICATIONS

Saito, et al., *The Papers of Joint Technical Meeting on Electron Devices and Semiconductor Power Converter*, IEE Japan, Nov. 28, 2002.

\* cited by examiner (a)

(b)

(c)

(d)

(e)

(f)

(g)

INSULATED GATE TYPE SEMICONDUCTOR DEVICE AND MANUFACTURING METHOD THEREOF

This is a 371 national phase application of PCT/JP2004/015179 filed 06 Oct. 2004, claiming priority to Japanese Application No. 2003-349806 filed 08 Oct. 2003, and No. 2003-375098 filed 05 Nov. 2003, the contents of which are incorporated herein by reference.

TECHNICAL FIELD

The present invention relates to an insulated gate type semiconductor device including trench gate structure and manufacturing method thereof. More particularly, it relates to an insulated gate type semiconductor device and manufacturing method thereof aiming to achieve both high withstand voltage design and low on-resistance design by relaxing electric field on semiconductor layer.

BACKGROUND ART

There have conventionally been proposed trench gate type semiconductor devices including trench gate structure as power device-dedicated insulated gate type semiconductor devices. For the conventional trench gate type semiconductor devices in general, high withstand voltage design and low on-resistance design are in trade-off relation.

Patent Document 1, for example, discloses a trench gate type semiconductor device, which pays attention to the above trade-off relation. The trench gate type semiconductor device of Patent Document 1 has structure as schematically shown in FIG. 30. That is, an N$^+$ source region 31 is arranged on upper surface side in FIG. 30 and an N$^+$ drain region 11 is at the bottom side. Between the N$^+$ source region 31 and the N$^+$ drain region 11, there are arranged a P body region 41 and an N$^-$ drift region 12 in order from upper side. Furthermore, a part of upper surface side is drilled and a gate trench 21 is formed in the drilled portion. Furthermore, a gate electrode 22 is built in the gate trench 21. Still further, a P floating region 50 is arranged immediately below the gate trench 21. Furthermore, the gate electrode 22 is insulated from a P body region 41 by a gate dielectric 24 formed on wall of the gate trench 21.

In this trench gate type semiconductor device, a depletion layer spreads from a PN junction portion of the P body region 41 and the N$^-$ drift region 12 toward the N$^+$ drain region 11 and another depletion layer spreads from a bottom portion of the P floating region 50 toward the N$^+$ drain region 11 when gate voltage is switched OFF. That is, the P floating region 50 promotes to get the N$^-$ drift region 12 depleted. Thereby, higher withstand voltage design of a drain-source section can be achieved, according to Patent Document 1.

Furthermore, as another example of a trench gate type semiconductor device, Patent Document 2 discloses of it. In the trench gate type semiconductor device of Patent Document, a P floating region 59 is arranged at a position away from a gate trench 21, as shown in FIG. 31. According to Patent Document 2, the P floating region 59 can realize higher withstand voltage design of a drain-source section, similar to the insulated gate type semiconductor device of FIG. 30.

The semiconductor device of FIG. 31 is manufactured by taking the following process. An N$^-$ silicon layer for an N$^-$ drift 12 is formed on an N$^+$ substrate which grows in to an N$^+$ drain region 11 by means of epitaxial growth. The N silicon layer is formed up to the level Z shown in FIG. 31. Next, the P floating region 59 is formed by means of ion implantation and the like. Further on, rest portion of the N$^-$ silicon layer is formed by means of epitaxial growth again. Thereby, there is thus formed a semiconductor device of which P floating region 59 is fully surrounded with an N$^-$ drift region 12 silicon. It is to be noted that by repeating the above process, plural P floating regions 59 different in depth can be formed depths.

Furthermore, a terminal area of the above-mentioned trench gate type semiconductor devices has structure as shown in FIG. 32, in general. That is, there is formed a P terminal diffusion region 61 of which depth is similar or deeper than a gate trench 21, in a terminal area. Thereby, a depletion region spreads from around the P terminal diffusion region 61 to relax concentration of electric field at a terminal area when gate voltage is switched OFF.

[Patent Document 1] JP Laid-open Patent Publication No. 10-98188

[Patent Document 2] JP Laid-open Patent Publication No. 9-191109

However, the semiconductor device of FIG. 30 has had the following problems. That is, the P floating region 50 is formed by means of ion implantation from the bottom portion of the gate trench 21. Therefore, the bottom portion of the gate trench 21 is damaged somewhat. Accordingly, in case the gate dielectric 24 is kept being formed with the gate trench 21 damaged, device characteristics and reliability are likely to lower. Furthermore, the gate electrode 22 faces the P floating region 50. Therefore, charges disperse inside the gate electrode 22, specifically, a portion where the gate electrode 22 faces the P body region 41 and a portion where the gate electrode 22 face the P floating region 50, when gate voltage is switched ON. As a result, on-resistance becomes large.

On the other hand, as to the semiconductor device of FIG. 31, the P floating region 59 is formed away from the gate trench 21. Therefore, higher withstand voltage design can be intended with evading an on-resistance problem. However, at least two times of epitaxial growth process is required to form a P floating region 54 completely surrounded by an N$^-$ drift region 12, which takes considerable time to complete.

Furthermore, for relaxing concentration of electric field at a terminal area, there is required process to form a P terminal diffusion region 61 of which thickness differs from thickness of respective P floating regions formed in a cell area. Therefore, the number of manufacturing process is larger and it takes time to complete. Furthermore, since heat load is large, impurity of an N$^-$ drift region 12 (epitaxial layer) diffuses and impurity concentration becomes uneven. For compensating the unevenness of impurity concentration, thickness of the N$^-$ drift region 12 must be thickened, which results in large on-resistance.

The present invention has been made to resolve at least one of the above-mentioned problems the conventional trench gate type semiconductor devices have had. That is, the present invention intends to provide an insulated gate type semiconductor device and manufacturing method thereof which realize both higher withstand voltage design and lower on-resistance design and can be manufactured simply.

DISCLOSURE OF THE INVENTION

To resolve the above mentioned problems the present invention provides an insulated gate type semiconductor device comprising: a body region arranged at upper surface side in a semiconductor substrate, the body region corresponding to a first conduction type semiconductor; a drift region being in contact with bottom surface of the body region, the drift region corresponding to a second conduction type semiconductor; and a trench section arranged with penetrating the body region from upper surface of the semiconductor substrate and reaching level further below bottom surface of the body region, wherein the insulated gate type semiconductor further comprises a floating region surrounded by the drift region, the floating region corresponding to a first conduction type semiconductor, bottom of the trench section is arranged in the floating region, in the trench section, there are formed a deposited insulating layer consisting of deposited insulating material and a gate electrode being arranged above the deposited insulating layer and facing the body region, and top of the deposited insulating layer is further above top of the floating region.

That is, the inventive insulated gate type semiconductor device has a floating region surrounded by a drift region. Owing to the floating region, depletion of the drift region at the time of switch OFF can be promoted. Furthermore, the floating region makes it possible to form peaks of electric field at plural portions, whereby a maximum peak value can be lowered. Furthermore, the inventive insulated gate type semiconductor device has a deposited insulating layer in a trench section. Thereby, a gate dielectric and gate electrode are not influenced by a damage of the trench section. As a result, deterioration of device characteristics and lowering of reliability can be restrained. Furthermore, top of the deposited insulating layer is further above top of the floating region. Such positioning prevents the gate electrode and the floating region from facing each other, whereby increase of on-resistance can be restrained.

It is preferable that the inventive insulted gate type semiconductor device further comprises an intermediate floating region arranged further above top of the floating region with being surrounded by the drift region, the intermediate floating region corresponding to a first conduction type semiconductor, wherein the trench section penetrates the intermediate floating region, and top of the deposited insulating layer is arranged further above top of the intermediate floating region.

That is, an intermediate floating region, functioning similar to the above-mentioned floating region, is arranged between a body region and a floating region. Thereby, peaks of electric field can be formed at three portions, at least, whereby a maximum peak value can be lowered further. As a result, both higher withstand voltage design and lower on-resistance design can be realized. It is to be noted that the number of the intermediate floating region is not limited to one but may be more than two. The larger the number of the intermediate floating regions is, the more peaks of electric field can be formed to realize lowering a maximum peak value.

It is preferable that the inventive insulated gate type semiconductor device according to claim 1 further comprises: an auxiliary trench section arranged with penetrating the body region from upper surface of the semiconductor substrate and reaching level further below bottom surface of the body region, the auxiliary trench section being filled with insulating material inside; and an auxiliary floating region surrounded by the drift region, the auxiliary floating region corresponding to a first conduction type semiconductor, wherein bottom of the auxiliary trench section is arranged in the auxiliary floating region. That is, plural floating region (including auxiliary floating regions) are formed in the drift region. Since such structure makes density of floating regions in the drift region high, manufacturing margin such as size of a floating region and the like can be taken large.

Furthermore, it is preferable that, in the inventive insulated gate type semiconductor device, depth of the trench section and depth of the auxiliary trench section are different. Thereby, the floating region and the auxiliary floating region can be arranged differently in thickness direction. Accordingly, peaks of electric field can be formed at three portions and a maximum peak value can be lowered further.

On the other hand, it is also preferable that depth of the trench section and depth of the auxiliary trench section are same. In case depth of the trench section and that of the auxiliary trench section are same, both of these section can be formed in a same manufacturing step. Therefore, the number of manufacturing steps can be reduced. Furthermore, since a distance between adjoining floating sections is short, a depletion layer can surely connect those floating sections even if density of a drift region is high. Therefore, lower on-resistance design can be realized. Furthermore, size of a floating region can be taken small. Furthermore, since thermal diffusion processing can be done in a same manufacturing step, diffusion of impurity is little and lowering of on-resistance due to thermal diffusion processing can be restrained. It is to be noted that depth of the trench section and that of the auxiliary trench section do not need to accurately coincide with each other. That is, subtle depth difference which arises at the time of forming trench is regarded within a range of same depth.

Furthermore, according to another aspect of the present invention, there is provided an insulated gate type semiconductor device comprising: a body region arranged at upper surface side in a semiconductor substrate, the body region corresponding to a first conduction type semiconductor; a drift region being in contact with bottom surface of the body region, the drift region corresponding to a second conduction type semiconductor; a trench section arranged with penetrating the body region from upper surface of the semiconductor substrate and reaching level further below bottom surface of the body region; and a gate electrode arranged in the trench section with facing the body region, wherein the insulated gate type semiconductor device further comprises: an auxiliary trench section arranged with penetrating the body region from upper surface of the semiconductor substrate and reaching level further below bottom surface of the body region, the auxiliary trench section being filled with insulating material inside; and an auxiliary floating region surrounded by the drift region, the auxiliary floating region corresponding to a first conduction type semiconductor, wherein bottom of the auxiliary trench section is arranged in the auxiliary floating region.

That is, the insulated gate type semiconductor device directed to another aspect of the present invention has an auxiliary floating region surrounded by a drift region. The auxiliary floating region can promote to get the drift region in OFF state depleted. Furthermore, the auxiliary floating region is arranged below an auxiliary trench section for the auxiliary floating region. Therefore, there is no need to consider positioning and size of a gate electrode. Accordingly, design flexibility of an auxiliary floating region is high. On the other hand, it is not always necessary to arrange a floating region at bottom of the trench section in which gate electrode is built. Therefore, as long as no ion implantation from the bottom, problems such as deterioration of device characteristics and lowering of reliability do not occur.

It is preferable that the inventive insulated gate type semiconductor device further comprises an auxiliary intermediate floating region arranged further above top of the auxiliary floating region with being surrounded by the drift region, the auxiliary intermediate floating region corresponding to a first conduction type semiconductor, wherein the auxiliary trench section penetrates the auxiliary intermediate floating region, and top of the deposited insulating layer is arranged further above top of the auxiliary intermediate floating region. Thereby, peaks of electric field can be formed at three portions, at least, and a maximum peak value can be lowered. Accordingly, both higher withstand voltage design and lower on-resistance design can be realized.

It is preferable that the inventive insulated gate type semiconductor device comprises: a second auxiliary trench section facing the auxiliary trench section with the gate electrode inserted between there, the second auxiliary trench section being arranged with penetrating the body region from upper surface of the semiconductor substrate and reaching level further below bottom surface of the body region, the second auxiliary trench section being filled with insulating material inside; and a second auxiliary floating region surrounded by the drift region, the second auxiliary floating region corresponding to a first conduction type semiconductor, wherein depth of the auxiliary trench section and depth of the second auxiliary trench section are different.

That is, since depth of an auxiliary trench section and that pf a second auxiliary trench section are different, an auxiliary floating region and a second auxiliary floating region are arranged differently in thickness direction. Accordingly, peaks of electric field can be formed at three portions and a maximum peak value can be lowered. Furthermore, since the auxiliary floating region and the second auxiliary floating region can be formed at same thermal diffusion processing, heat load is taken small.

It is preferable that, in the inventive insulated gate type semiconductor device, the auxiliary trench section is structure in dot pattern, viewed from top side of the semiconductor substrate. Thereby a current path is taken wide and lower on-resistance design can be realized.

It is preferable that, the inventive insulated gate type semiconductor device is structured such that, in a region around a cell region, there are arranged: a terminal trench section filed with insulating material inside; and a terminal floating region surrounded by the drift region, the terminal floating region corresponding to a first conduction type semiconductor, and bottom of the terminal trench section is arranged in the terminal floating region.

That is, a floating region functioning similar to the floating region is arranged in a terminal area, as well. Thereby, higher withstand voltage design can be realized for a terminal area. Furthermore, size of a terminal floating region is same as that of a floating region in a cell area. Therefore, it is compact and flexible for of size determination. Furthermore, since a terminal floating region and a floating region can be formed at a same manufacturing step, they cay be formed simply. Furthermore, since those regions are formed in a same manufacturing step, heat load is smaller in comparison with a case of a conventional semiconductor device.

According to the present invention, there is also provided manufacturing method of an insulated gate type semiconductor device which comprises: a body region arranged at upper surface side in a semiconductor substrate, the body region corresponding to a first conduction type semiconductor; a drift region being in contact with bottom surface of the body region, the drift region corresponding to a second conduction type semiconductor; a trench section arranged with penetrating the body region from upper surface of the semiconductor substrate and reaching level further below bottom surface of the body region; and a gate electrode arranged in the trench section with facing the body region, the manufacturing method comprising: trench section forming step of forming the trench section in the semiconductor substrate on which the drift region and the body regions have been formed; impurity injecting step of injecting impurity from bottom of a trench section formed in the trench section forming step; insulating material laying-up step of laying up insulating material in the trench section after impurity is injected through the impurity injecting step; and floating region forming step of forming a floating region by applying thermal diffusion processing after impurity is injected in the insulating material laying-up step.

In the manufacturing method, a start substrate corresponds to a semiconductor substrate formed such that a drift region is formed by means of epitaxial growth and the like, and after that, a body region is formed thereon by means of impurity introduction technology such as ion implantation and the like and thermal diffusion processing. After that, a trench section is formed penetrating the body region from top of its start material in trench section forming step. Next, in floating region forming step, a floating region is formed by implanting impurity from the trench section. That is, a floating section is formed after formation of a drift region and a body region. Therefore, there is not required a step to form mono crystal silicon layer by means of epitaxial growth again after formation of floating region. Accordingly, an insulated gate type semiconductor device including a floating region can be manufactured with simple manufacturing steps.

It is preferable that the inventive manufacturing method of an insulated gate type semiconductor device further comprises: trench section drilling step of further drilling down bottom of the trench section after impurity is injected in the impurity injecting step; and impurity re-injecting step of re-injecting impurity from bottom the trench section drilled further in the trench section drilling step. Thereby, plural stages of floating region formed in thickness direction of the semiconductor substrate formed by first time of epitaxial growth.

It is preferable that, in the inventive manufacturing method of an insulated gate type semiconductor device, the trench section is formed in a cell region and a peripheral region of the cell region in the trench section forming step, and the insulating material laying-up step comprises: insulating material filling step of filling inside of the trench section formed in the trench section forming step with insulating material; and deposited material adjusting step of adjusting height of a deposited insulating layer by eliminating a portion of insulating material in the trench section filled with insulating material in the insulating material filling step, particularly, the trench section in the cell region.

That is, it is preferable that a trench section is formed in a periphery region of a cell area and a terminal area in the trench section forming step. Thereby, a floating region can be formed in a region other than a cell region, in floating region forming step after formation of a trench section, without adding special manufacturing for forming a terminal area. Furthermore, in insulating material filling step, inside of the trench section is filled with insulating material. Subsequently, after a portion of insulating material is eliminated from only a trench section in the cell region in deposited material adjusting step, gate electrode is formed in the eliminated portion of the trench section in gate electrode forming step. Thereby, a trench section in which gate electrode is built is formed in the cell region, and a trench section entirety of which is filled with insulating material is formed in the periphery region of the cell region.

BEST MODE FOR CARRYING OUT THE INVENTION

Exemplary embodiments of the invention are described below specifically while referring to accompanying drawings. In the embodiments, the invention is applied in a power MOS for controlling conduction between drain and source (DS) by application of voltage to the insulated gate.

FIRST EMBODIMENT

Figure 1:
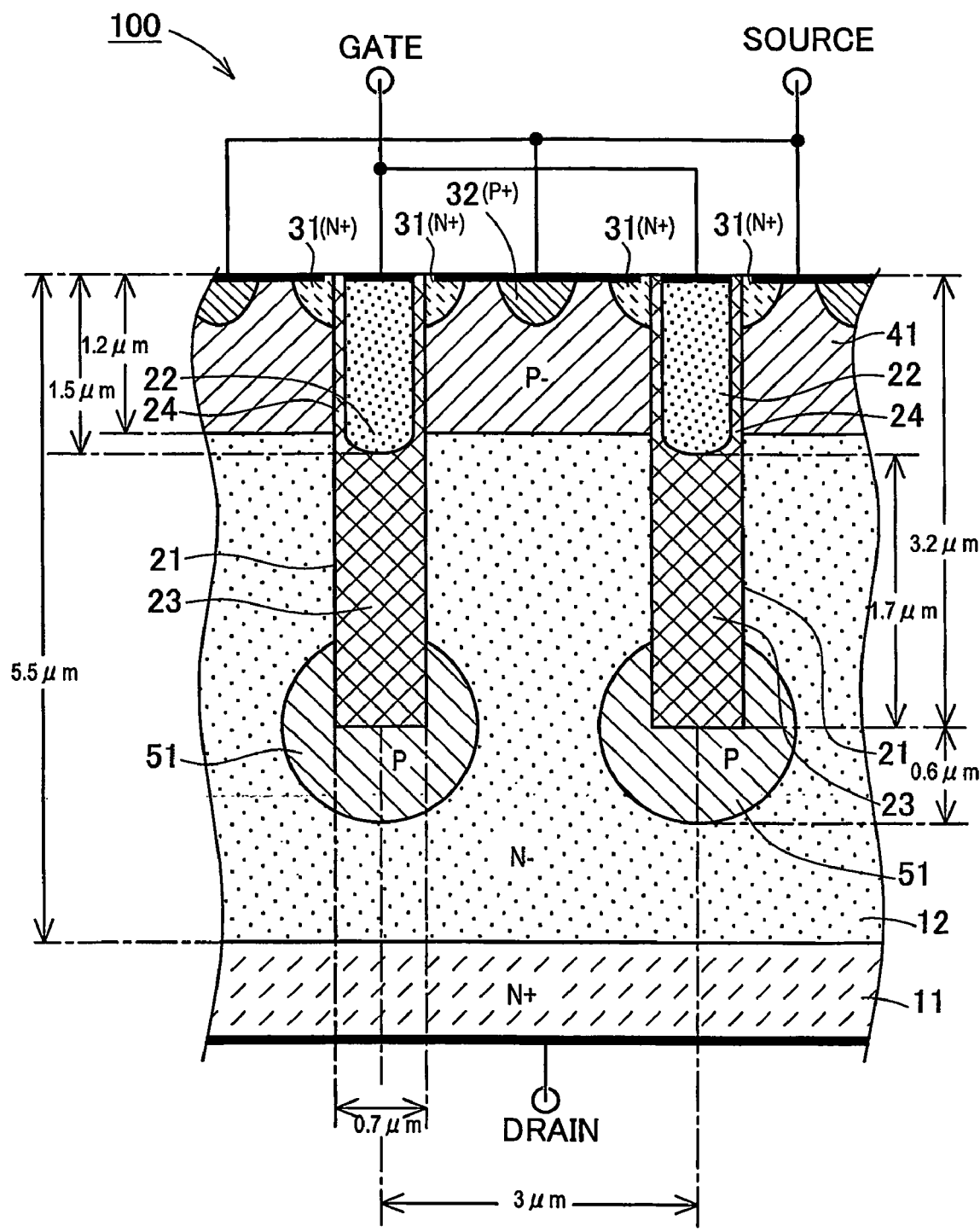
FIG. 1 is a sectional view showing structure of an insulated gate type semiconductor device directed to a first embodiment.
Figure 30:
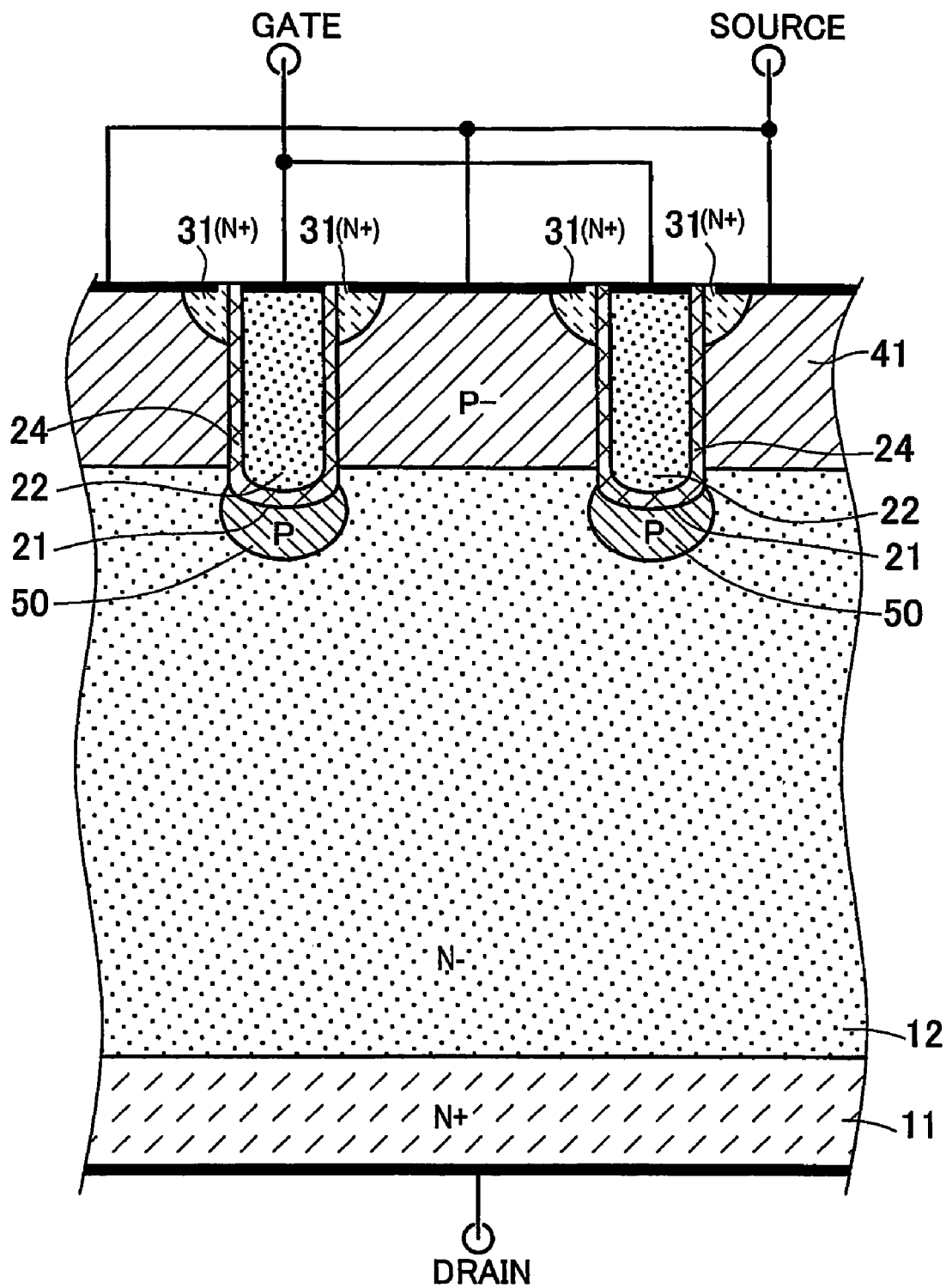
FIG. 30 is a sectional view showing structure of a conventional insulate gate type semiconductor device (1).
Figure 31:
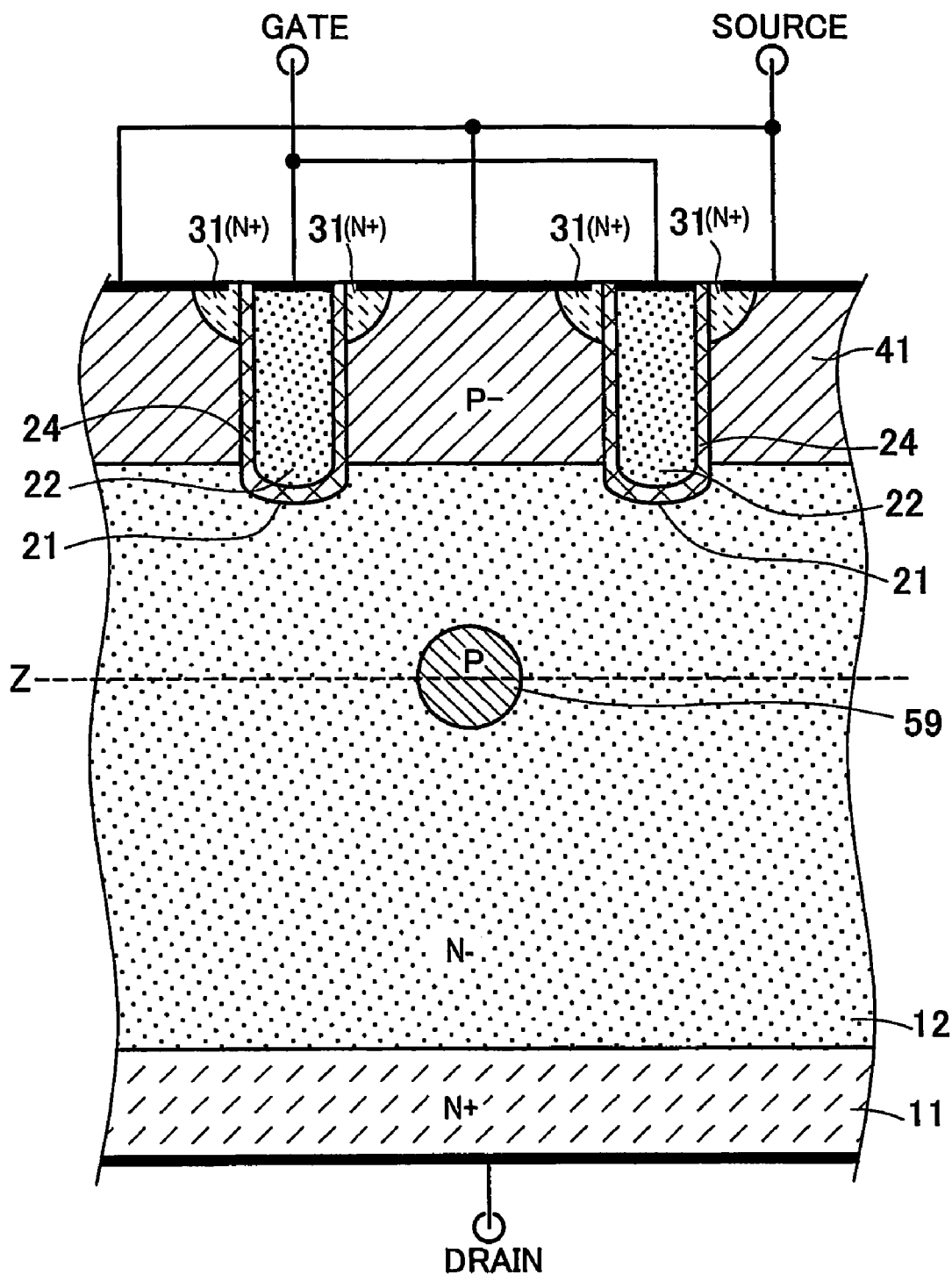
FIG. 31 is a sectional view showing structure of a conventional insulate gate type semiconductor device (2).

An insulated gate type semiconductor device 100 (hereinafter called semiconductor device 100) in a first embodiment has a structure as shown in a sectional view in FIG. 1. In FIG. 1, constituent elements having same reference numerals as in the conventional semiconductor device shown in FIG. 30 have same functions. In the present specification, the entire assembly formed by a start substrate and a single crystal silicon portion formed on the start substrate by epitaxial growth is called a semiconductor substrate.

In the semiconductor device 100, at the upper side in FIG. 1 in the semiconductor substrate, N+ source region 31 is formed together with P+ source region 32 provided at high concentration for lowering the contact resistance. At the lower side, on the other hand, N+ drain region 11 is provided. Between them, P– body region 41 and N– drift region 12 are provided from the upper side. The thickness of the combined region of P– body region 41 and N– drift region 12 (hereinafter called epitaxial layer) is about 5.5 μm (in which the thickness of P– body region 41 is about 1.2 μm).

By digging part of the upper side of the semiconductor substrate, a gate trench 21 is formed. The depth of the gate trench 21 is about 3.2 μm, and it penetrates through the P– body region 41. In the bottom of the gate trench 21, a deposited insulating layer 23 is formed by deposit of insulating material. More specifically, the deposited insulating layer 23 is formed by collection of silicon oxide to a height of about 1.7 μm from the bottom of the gate trench 21. On the deposited insulating layer 23, further, a gate electrode 22 is formed by deposit of conductor (for example, polysilicon). The lower end of the gate electrode 22 is positioned beneath the lower side of the P– body region 41. The gate electrode 22 is opposite to the N+ source region 31 and P– body region 41 of semiconductor substrate by way of a gate dielectric 24 formed at the wall surface of the gate trench 21. That is, the gate electrode 22 is insulated from the N+ source region 31 and P– body region 41 by the gate dielectric 24. In the semiconductor device 100 having such structure, by application of voltage to the gate electrode 22, a channel effect is generated in the P– body region 41, and hence conduction between the N+ source region 31 and N+ drain region 11 is controlled.

Further, the semiconductor substrates includes a P floating region 51 enclosed by the N– drift region 12. The section of the P floating region 51 is, as shown in a sectional view in FIG.

1, a nearly circular shape of radius of 0.6 µm centered on the bottom of the gate trench 21. Each gate trench 21 is formed in a pitch of about 3.0 µm. Therefore, between adjacent P floating regions 51, 51, a sufficient space is reserved. In ON state, hence, the presence of P floating region 51 will not impede the flow of drain current. The radius (about 0.6 µm) of the P floating region 51 is smaller than ½ of the thickness (about 1.7 µm) of the deposited insulating layer 23. Therefore, the upper end of the deposited insulating layer 23 is positioned higher than the upper end of the P floating region 51. Hence, the gate electrode 22 depositing on the deposited insulating layer 23 is not opposite to the P floating region 51.

The semiconductor device 100 of the embodiment has the P floating region 51 provided beneath the gate trench 21 incorporating the gate electrode 22, and it has the following characteristics as compared with the insulated gate type semiconductor device not having this. That is, when the gate voltage is switched off, by the DS voltage, a depletion layer is formed from the PN junction position with the P– body region 41 in the N– drift region 12. Peak of field intensity appears near the PN junction position. When the leading end of depletion layer reaches the P floating region 51, the P floating region 51 falls in punch-through state, and the potential is fixed. When the DS applied voltage is high, a depletion layer is also formed from the lower end of the P floating region 51. Separately from the PN junction position with the P– body region 41, peak of field intensity also appears near the lower end of the P floating region 51. That is, peak of electric field can be formed at two positions, and the maximum peak value can be lowered. As a result, a higher withstand voltage design is realized. Because of high withstand voltage, by raising the impurity concentration of the N– drift region 12, a lower on-resistance design is realized.

Moreover, since the semiconductor device 100 has the deposited insulating layer 23 provided in the gate trench 21, it has also the following characteristics. That is, since the P floating region 51 is formed by ion implantation or the like from the bottom of the gate trench 21 as described below, the bottom of the gate trench 21 is damaged more or less. However, by the presence of the deposited insulating layer 23, effects of bottom damage of the gate trench 21 can be evaded, and defects such as deterioration of device characteristic or decline of reliability can be prevented. Also by the deposited insulating layer 23, effects due to confrontation of gate electrode 22 and P floating region 51 are lessened, and the on-resistance in the P– body region 41 is decreased. As compared with a structure not having the deposited insulating layer 23, since the gate electrode 22 is smaller, and the gate-drain capacity Cgd is small, and the switching speed is faster.

Figure 2:
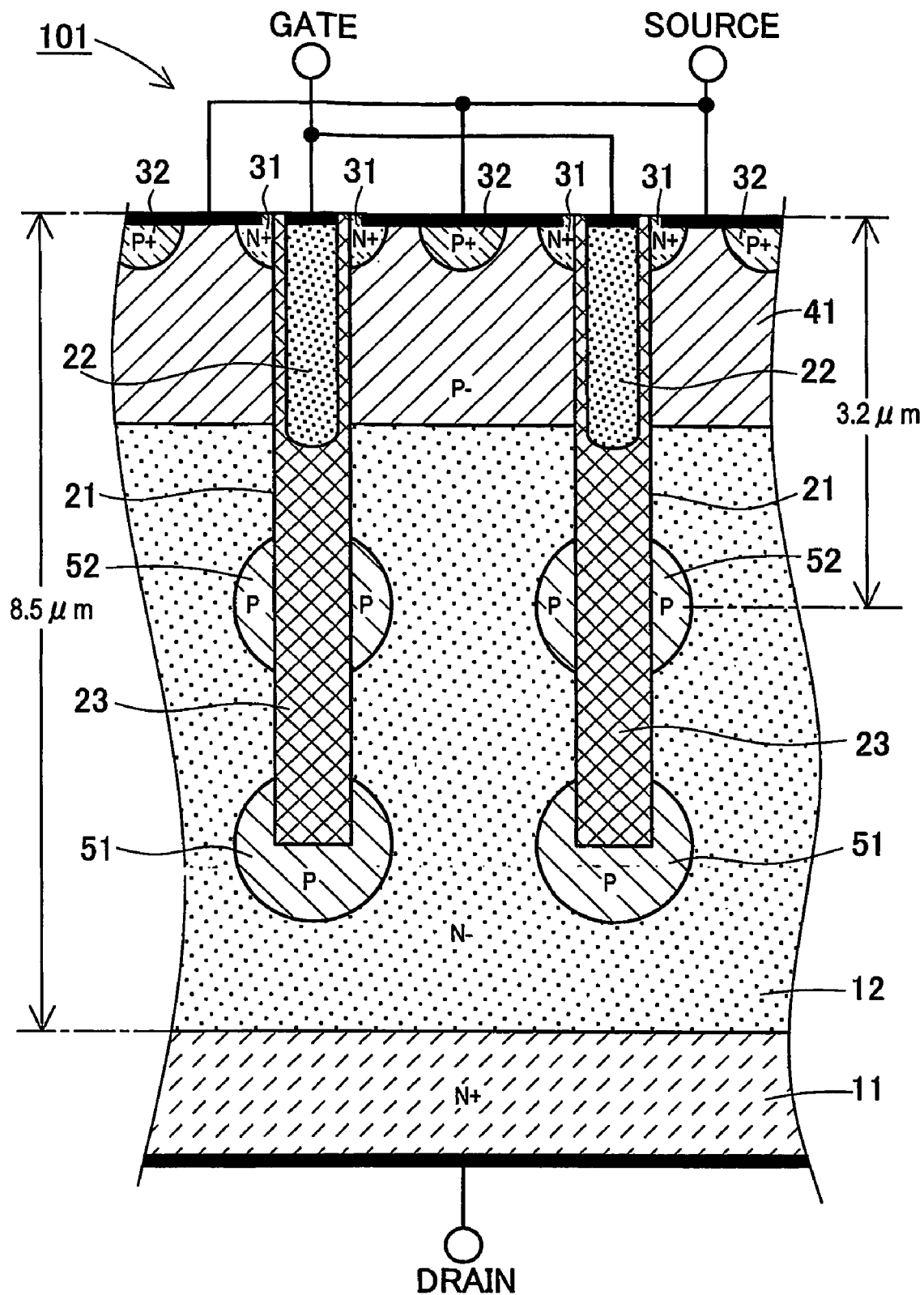
FIG. 2 is a sectional view showing structure of the insulated gate type semiconductor device (two-stage-structured P floating region) directed to the first embodiment.

A plurality of P floating regions may be provided in the thickness direction of the semiconductor device. For example, as shown in FIG. 2, two stages of P floating regions may be provided. In a semiconductor device 101 shown in FIG. 2, as compared with the semiconductor device 100 in FIG. 1, deeper (about 8.5 µm) epitaxial layer and gate trench 21 are provided. It also has a P floating region 51 centered on the bottom of the gate trench 21, and a P floating region 52 positioned between the P floating region 51 and P– body region 41. As a result, the depletion layer formed from the PN junction position with the P– body region 41 once reaches the P floating region 52, and then reaches the P floating region 51. Accordingly, aside from the PN junction position with the P– body region 41, peak of field intensity appears at both lower end of the P floating region 52 and lower end of P floating region 51. Therefore, three peaks of electric field are formed, and the maximum peak value may be further decreased. Incidentally, by increasing the number of P floating regions 52 positioned between the P floating region 51 and P– body region 41, the number of peaks of electric field can be increased. Accordingly, the greater the number of P floating regions 52, the higher withstand voltage design and lower on-resistance design can be realized.

Figure 3:
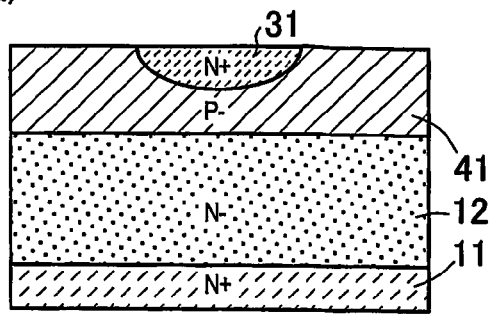
FIGS. 3(a)-3(g) illustrate manufacturing process of the insulated gate type semiconductor device directed to FIG. 1.
Figure 3:
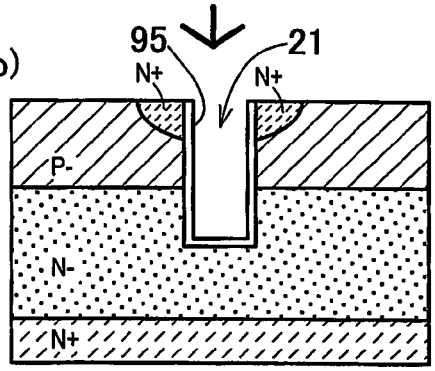
Figure 3:
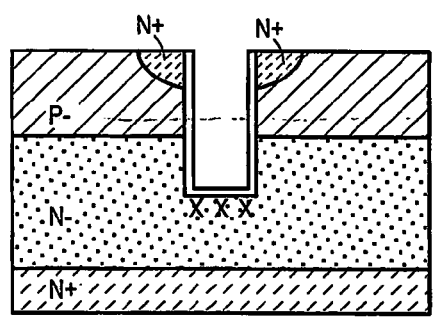
Figure 3:
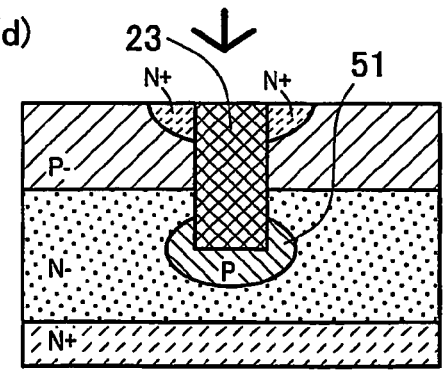
Figure 3:
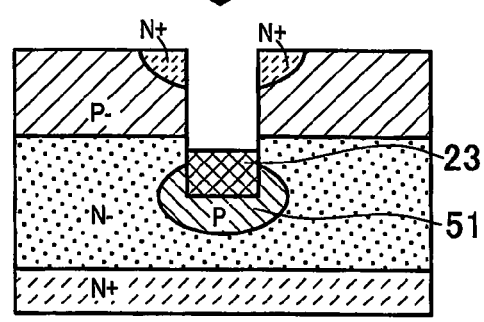
Figure 3:
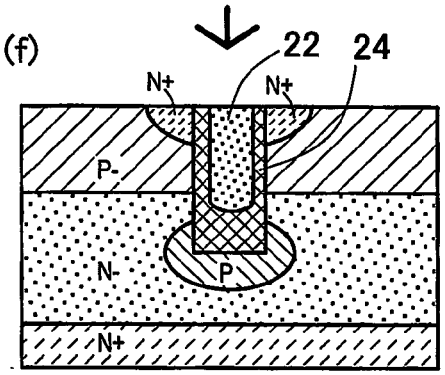
Figure 3:
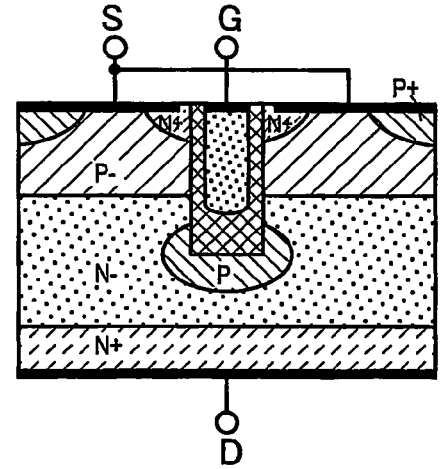

The manufacturing process of the semiconductor device 100 shown in FIG. 1 is explained by referring to FIG. 3. To begin with, N– type silicon layer is formed by epitaxial growth on N+ substrate as N+ drain region 11. This N– type silicon layer (epitaxial layer) forms the regions of N– drift region 12, P– body region 41, and N+ source region 31. By subsequent ion implantation or the like, P– body region 41 and N+ source region 31 are formed. As a result, a semiconductor substrate having epitaxial layer is fabricated on N+ drain region 11 as shown in FIG. 3(a).

Next, as shown in FIG. 3(b), penetrating the P– body region 41, a gate trench 21 is formed until its bottom reaches up to the N– drift region 12. Later, by thermal oxidation processing, an oxide film 95 of about 50 nm in thickness is formed on the wall of the gate trench 21. Further, as shown in FIG. 3(c), ion implantation is started from the bottom of the gate trench 21. Ion implantation is carried out after forming the oxide film 95 because ion implantation is not applied to the side wall of the gate trench 21. After ion implantation, the oxide film 95 in the gate trench 21 is removed. When burying the oxide film, if there is problem of interface state, or it is better for burying the insulating material when a thin oxide film is formed on the silicon surface, it is better to form a thin thermal oxide film of about 50 nm and then bury the insulating material. Such process is not needed if it is better for burying the insulating material when the silicon surface is exposed.

As shown in FIG. 3(d), an insulating material (silicon oxide or the like) 23 is deposited in the gate trench 21 by CVD. Thermal diffusion is processed for the purposes of both annealing of the insulating material and formation of P floating region 51. As a result, the P floating region 51 is formed. The size of the P floating region 51 is determined by the bottom dimensions of the gate trench 21. The position of the P floating region 51 in the thickness direction is determined by the depth of the trench. That is, since the P floating region 51 is determined on the basis of the gate trench 21, its dimensional precision is high. Next, as shown in FIG. 3(e), by etching the semiconductor substrate in which the insulating material deposits, part of the insulating material is removed. Thus, a space for forming the gate electrode 22 is preserved.

An oxide film 24 is formed by thermal oxidation on the upside of the semiconductor substrate and the wall surface of the gate trench 21. This is the gate oxide film 24. In the space reserved in the preceding step, a conductor (polysilicon or the like) is deposited, and a gate electrode 22 as shown in FIG. 3(f) is formed. Then, by forming the source electrode and drain electrode, an insulated gate type semiconductor device, that is, semiconductor device 100 is fabricated as shown in FIG. 3(g).

Figure 4:
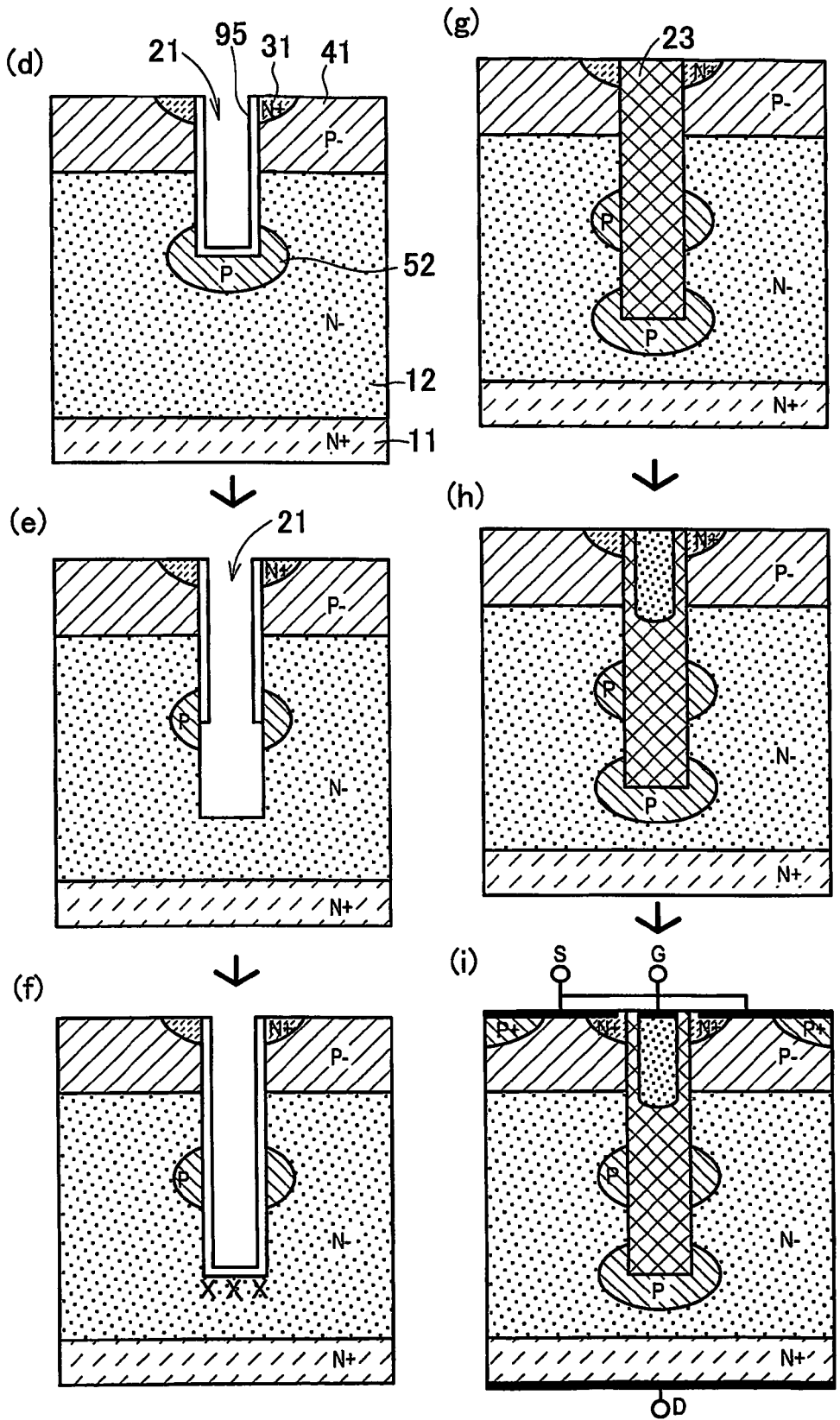
FIGS. 4(d)-4(i) illustrate manufacturing process of the insulated gate type semiconductor device directed to FIG. 2.

The semiconductor 101 shown in FIG. 2 is fabricated in the manufacturing process as shown in FIG. 4. In this manufacturing process, it is same as the manufacturing process of the semiconductor device 100 shown in FIG. 1 up to the step of ion implantation (corresponding to FIG. 3(c)) after forming the gate trench 21. Thereafter, in the semiconductor substrate after ion implantation, without depositing the insulating material, thermal diffusion is processed. As a result, a P floating region 52 is formed as shown in FIG. 4(d).

As shown in FIG. 4(e), by etching again, the gate trench 21 is much excavated. As shown in FIG. 4(f), by thermal oxidation processing, an oxide film 95 is formed on the wall of the gate trench 21. From the bottom of the gate trench 21, again, ion implantation is executed. After the ion implantation, the oxide film 95 in the gate trench 21 is removed. When burying the oxide film, if there is problem of interface state, or it is better for burying the insulating material when a thin oxide film is formed on the silicon surface, it is better to form a thin thermal oxide film of about 50 nm and then bury the insulating material. Such process is not needed if it is better for burying the insulating material when the silicon surface is exposed.

As shown in FIG. 4(g), an insulating material (silicon oxide or the like) 23 is deposited in the gate trench 21 by CVD. Thermal diffusion is processed for the purposes of both annealing of the insulating material and formation of P floating region 51. As a result, the P floating region 51 is formed.

In the same procedure as in the process after FIG. 3(e), a gate electrode 22 incorporated in the gate trench 21 is formed as shown in FIG. 4(h). Thereafter, by forming the source electrode and drain electrode, an insulated gate type semiconductor device, that is, semiconductor device 101 as shown in FIG. 4(i) is fabricated. The number of P floating regions 52 can be increased in the thickness direction by repeating the process from FIG. 4(d) to FIG. 4(f).

Figure 5:
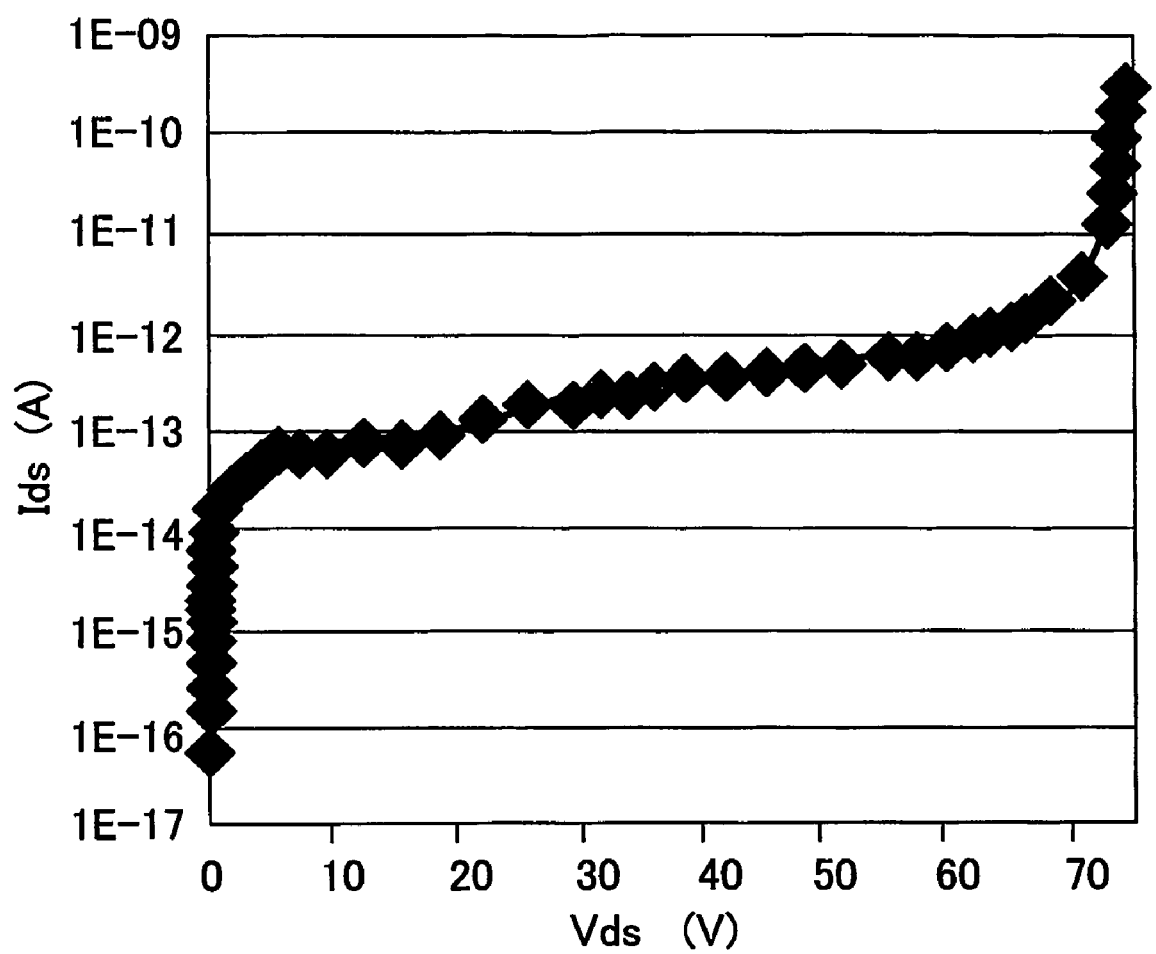
FIG. 5 is a graph showing relation of voltage and current at a between-drain-and-source portion (gate voltage is constant).
Figure 6:
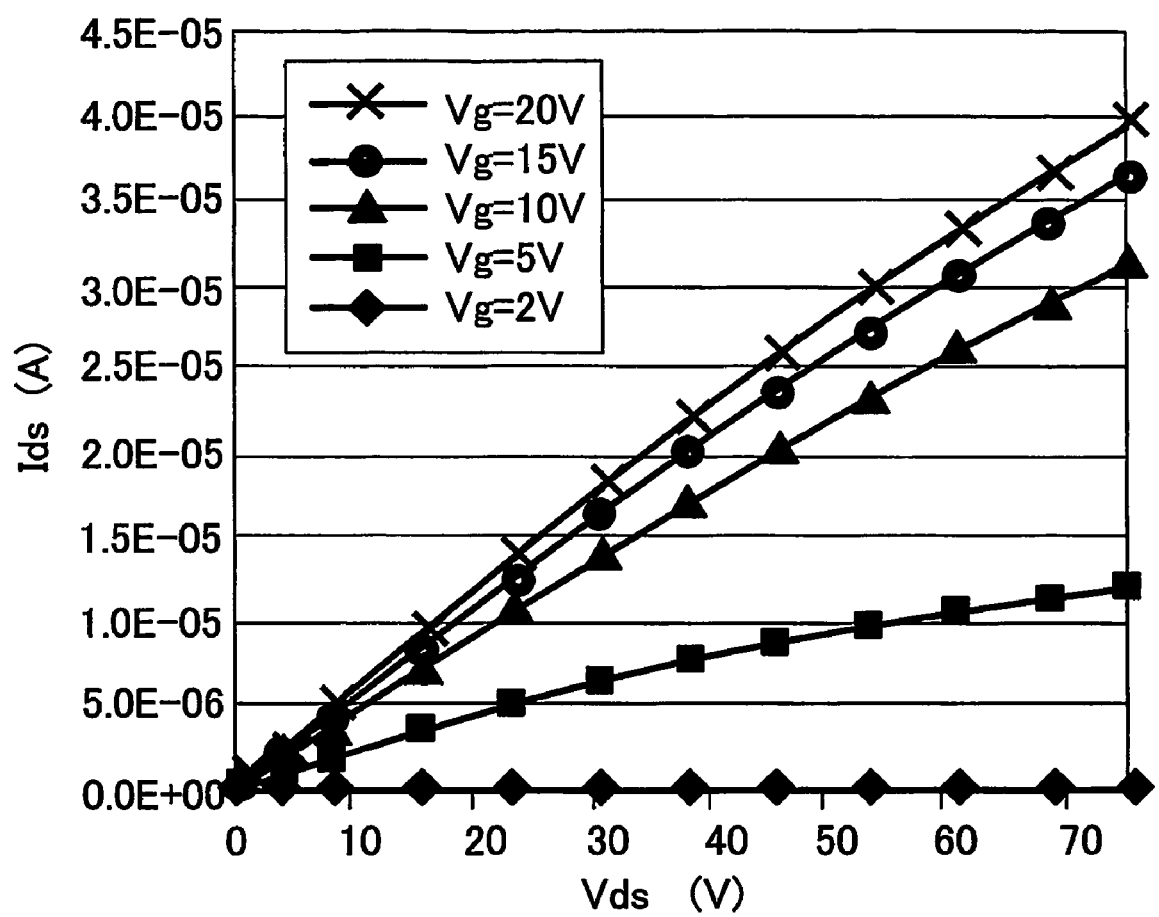
FIG. 6 is a graph showing relation of voltage and current at a between-drain-and-source portion for each gate voltage.

In the semiconductor device 100 shown in FIG. 1, results of measurement of DS withstand voltage and on-resistance are explained. FIG. 5 is a graph showing the relation of DS voltage Vds and current Ids with the gate voltage Vg fixed at 0 V. As shown in FIG. 5, while the voltage Vds is within 10 V to 70 V, the value of current Ids is nearly constant. When the voltage Vds exceeds 72 V, the current Ids increases suddenly. It is known that breakdown has occurred at 72V. FIG. 6 is a simulation graph showing the relation of DS voltage Vds and current Ids with the gate voltage Vg variable. The inclination of the graph corresponds to the DS on-resistance. Generally, the silicon limit (unipolar limit) is expressed by the on-resistance (Ron) calculated in formula (1) below. In formula (1), Vb denotes the withstand voltage.

$$\text{Ron}=8.33\times10^{-9}(\text{Vb})^{2.5} \tag{1}$$

For example, in the case of withstand voltage of 72 V, the on-resistance 36.6 mΩ·mm² is the unipolar limit. In this embodiment, for example, at the gate voltage Vg=15 V, the on-resistance was 34.0 mΩ·mm² from the graph inclination of Vg=15 V in FIG. 6. Therefore, the insulated gate type semiconductor device of the embodiment realizes a higher on-resistance design exceeding the unipolar limit.

SECOND EMBODIMENT

Figure 7:
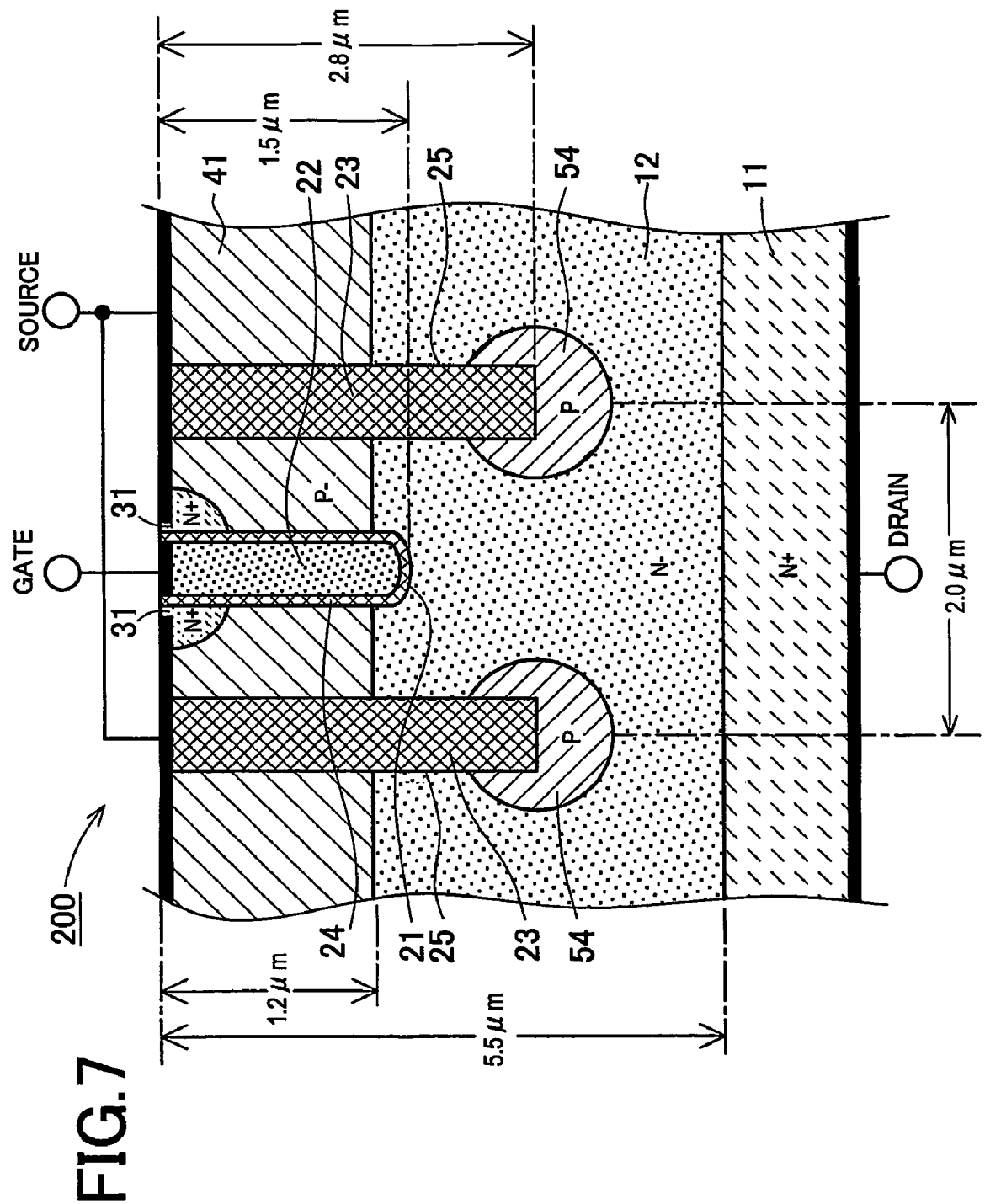
FIG. 7 is a sectional view showing structure of an insulated gate type semiconductor device directed to a second embodiment.

An insulated gate type semiconductor device 200 (hereinafter called semiconductor device 200) in a second embodiment has a structure as shown in a sectional view in FIG. 7. It is a feature of the semiconductor device 200 in this embodiment is that a trench for P floating region is provided, with the bottom of the trench positioned in the P floating region. In this respect, it is different from the semiconductor device 100 (see FIG. 1) in which the bottom of the trench incorporating the gate electrode is positioned in the P floating region. In FIG. 7, constituent elements having same reference numerals as in the semiconductor device 100 shown in FIG. 1 have same functions.

The semiconductor device 200, same as the semiconductor device 100 of the first embodiment, comprises N+ source region 31, N+ drain region 11, P− body region 41, and N− drift region 12. By excavating part of the upper side of the semiconductor device 200, a gate trench 21 is formed. The gate trench 21 incorporates a gate electrode 22. The gate electrode 22 is insulated from the P− body region 41 by the gate dielectric 24 formed on the wall of the gate trench 21. In the semiconductor device 200, by application of voltage to the gate electrode 22, a channel effect is produced in the body region 41, and thereby the conduction between the N+ source region 31 and N+ drain region 11 is controlled.

The semiconductor device 200 includes, aside from the gate trench 21 incorporating the gate electrode 22, trenches 25, 25 provided at both sides of the gate trench 21. Each trench 25 is filled with insulating material. Further, a P floating region 54 is formed in contact with the bottom of the trench 25, being surrounded by an N− drift region 12. The section of the P floating region 54 is a nearly circular shape centered on the bottom of the trench 25 as shown in a sectional view in FIG. 7.

In the semiconductor device 200 of the embodiment, same as the semiconductor device 100 in the first embodiment, by forming the P floating region 54, the peak of electric field is formed in two positions, and the maximum peak value can be decreased. As compared with the semiconductor device 100 in the first embodiment, it has the following features. That is, the structure of the gate electrode is the same of the conventional structure, and it is easy to fabricate. That is, the distance between the gate electrode 22 and P floating region 54 is longer as compared with that in the first semiconductor device 100. Accordingly, it is easier to hold the current path, and a lower on-resistance design can be realized. Besides, since the P floating region opposite to the gate electrode 22 is not provided, it is free from problems of effects of ion implantation or increase of on-resistance.

Figure 8:
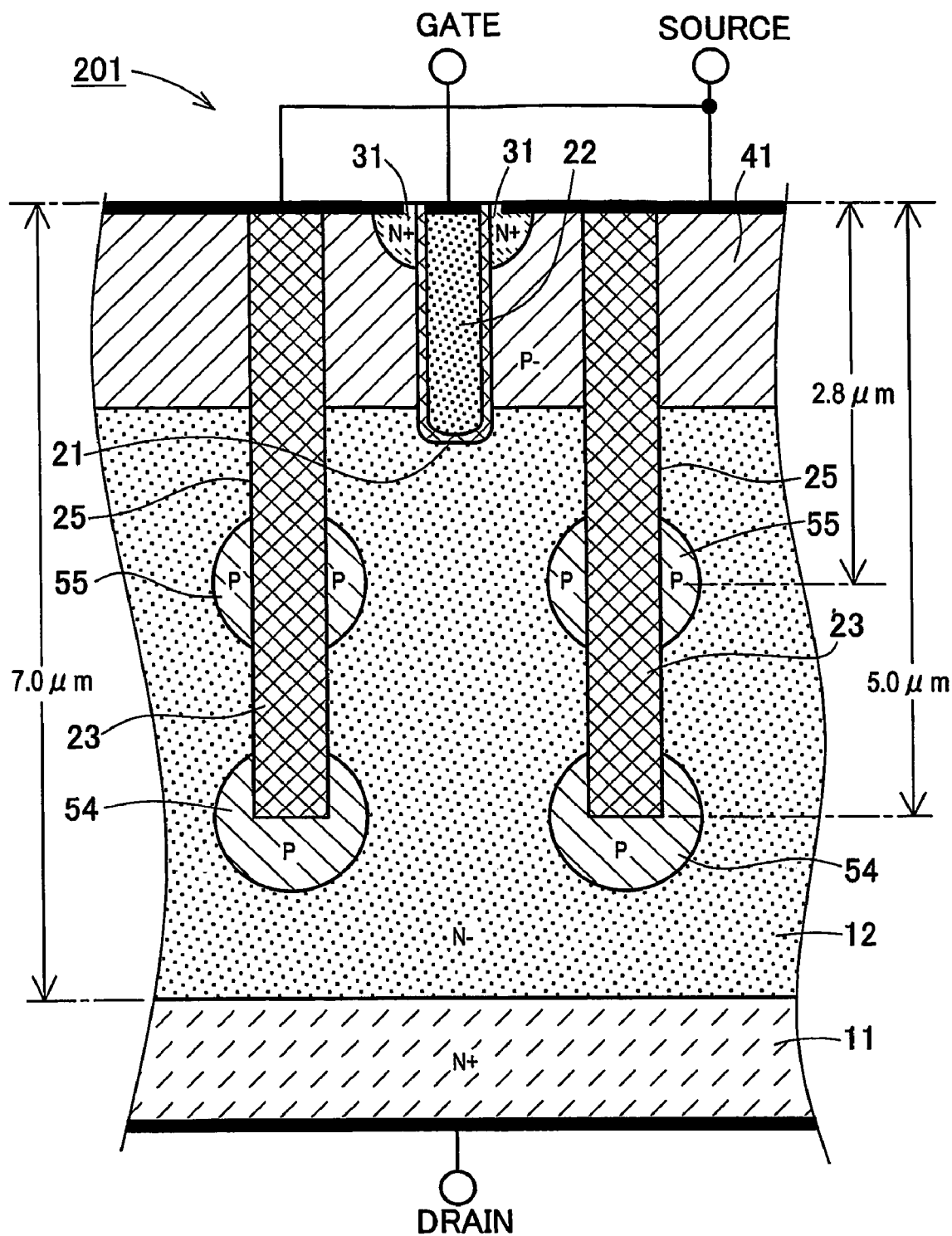
FIG. 8 is a sectional view showing structure of the insulated gate type semiconductor device (two-stage-structured P floating region) directed to the second embodiment.

Further, same as in the semiconductor device 100 in the first embodiment, a plurality of P floating regions may be provided in the thickness direction of the semiconductor device. For example, as shown in FIG. 8, P floating regions may be formed in two-stage structure. In the semiconductor device 201 shown in FIG. 8, trenches 25 are formed deeper than in the semiconductor device 200 shown in FIG. 7. The gate trench 21 for gate electrode 22 is same in depth as the semiconductor device 200 shown in FIG. 7, but in the semiconductor device 201, the P floating region 54 centered on the bottom of the trench 25 is formed together with the P floating region 55 positioned between the P floating region 54 and P− body region 41. As a result, the peak of electric field is formed at three positions, and a further higher withstand voltage design and lower on-resistance design can be realized.

Figure 9:
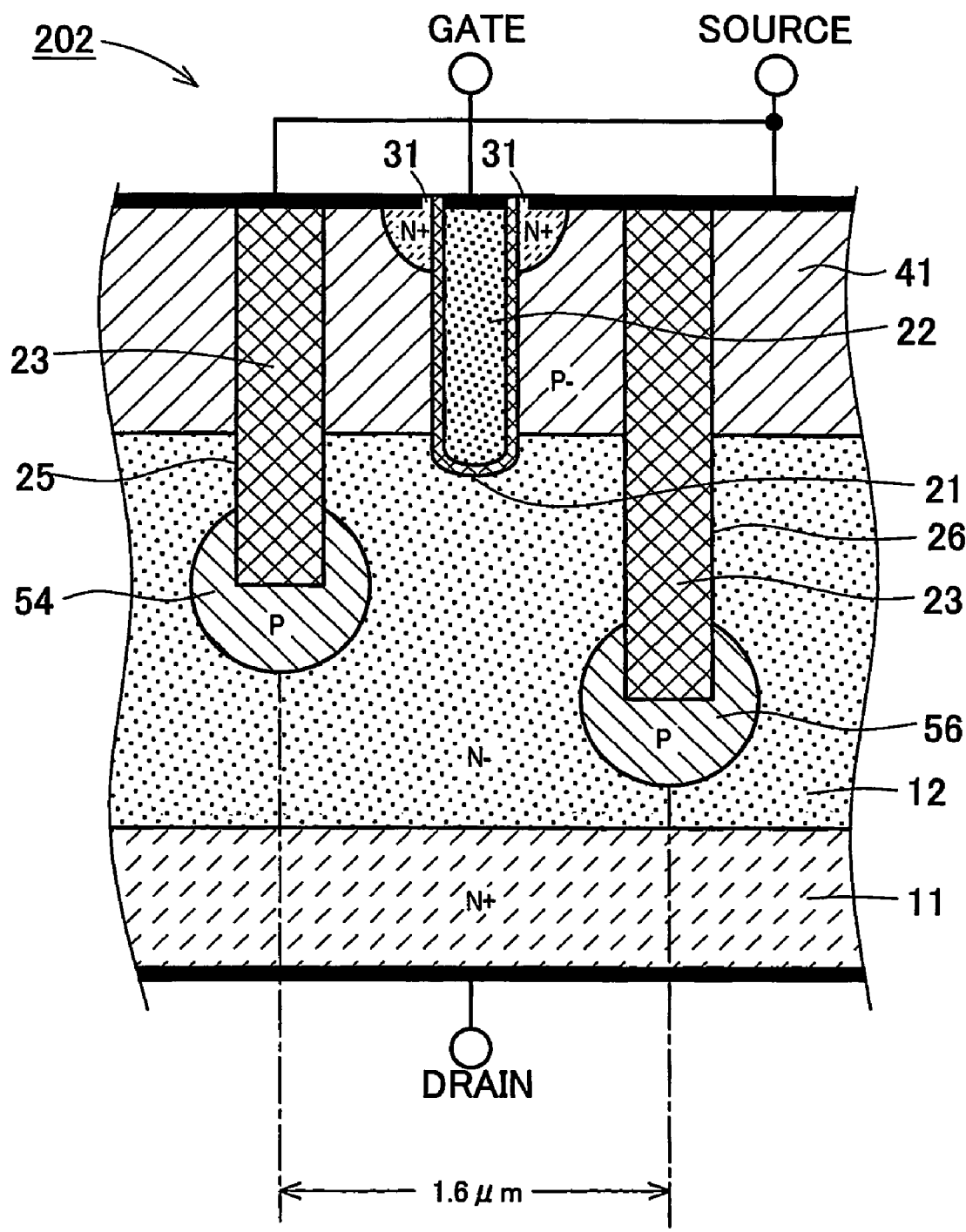
FIG. 9 is a sectional view showing structure of the insulated gate type semiconductor device (P floating region different in position of thickness direction) directed to the second embodiment.

Besides, as shown in FIG. 9, a trench 26 of which depth is not same as a trench 25 may be provided with the gate electrode 22 being arranged between the trench 25 and the trench 26. This trench 26 is also filled with insulating material, and its bottom is positioned in the P floating region 56. That is, the P floating region 56 is provided at a position different from the P floating region 54 in the thickness direction. Therefore, same as in the semiconductor device 201 shown in FIG. 8, the peak of electric field is formed at three positions. Therefore, the higher withstand voltage design and lower on-resistance design can be realized. In the semiconductor device 202, the trench pitch is designed slightly narrower than in the semiconductor device 201 in order to link the depletion layers more securely in the width direction. In the semiconductor device 202, only one P floating region contacts with each trench, and hence the ion implantation and thermal diffusion process for forming each P floating region is required only once. Hence, characteristic deterioration due to thermal diffusion process can be minimized. Each trench can be filled in same process, and the manufacturing process is simplified.

Figure 10:
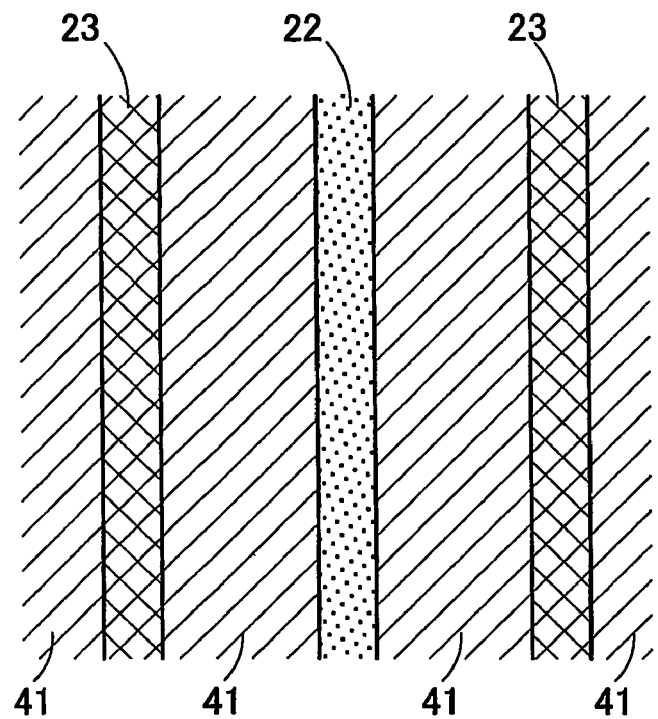
FIG. 10 is a top view showing array of an insulated gate type semiconductor device with stripe-patterned trench.
Figure 11:
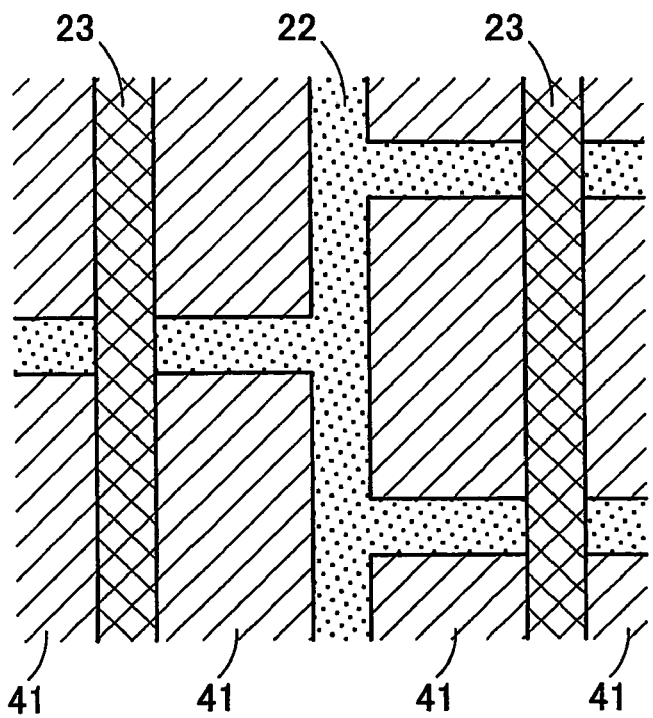
FIG. 11 is a top view showing array of an insulated gate type semiconductor device with mesh-patterned trench.

The shape of each trench is a stripe long in the depth direction in the drawing, mesh shape, dot shape, etc. For higher withstand voltage design, the stripe shape as shown in FIG. 10 or mesh shape as shown in FIG. 11 may be effective.

Figure 12:
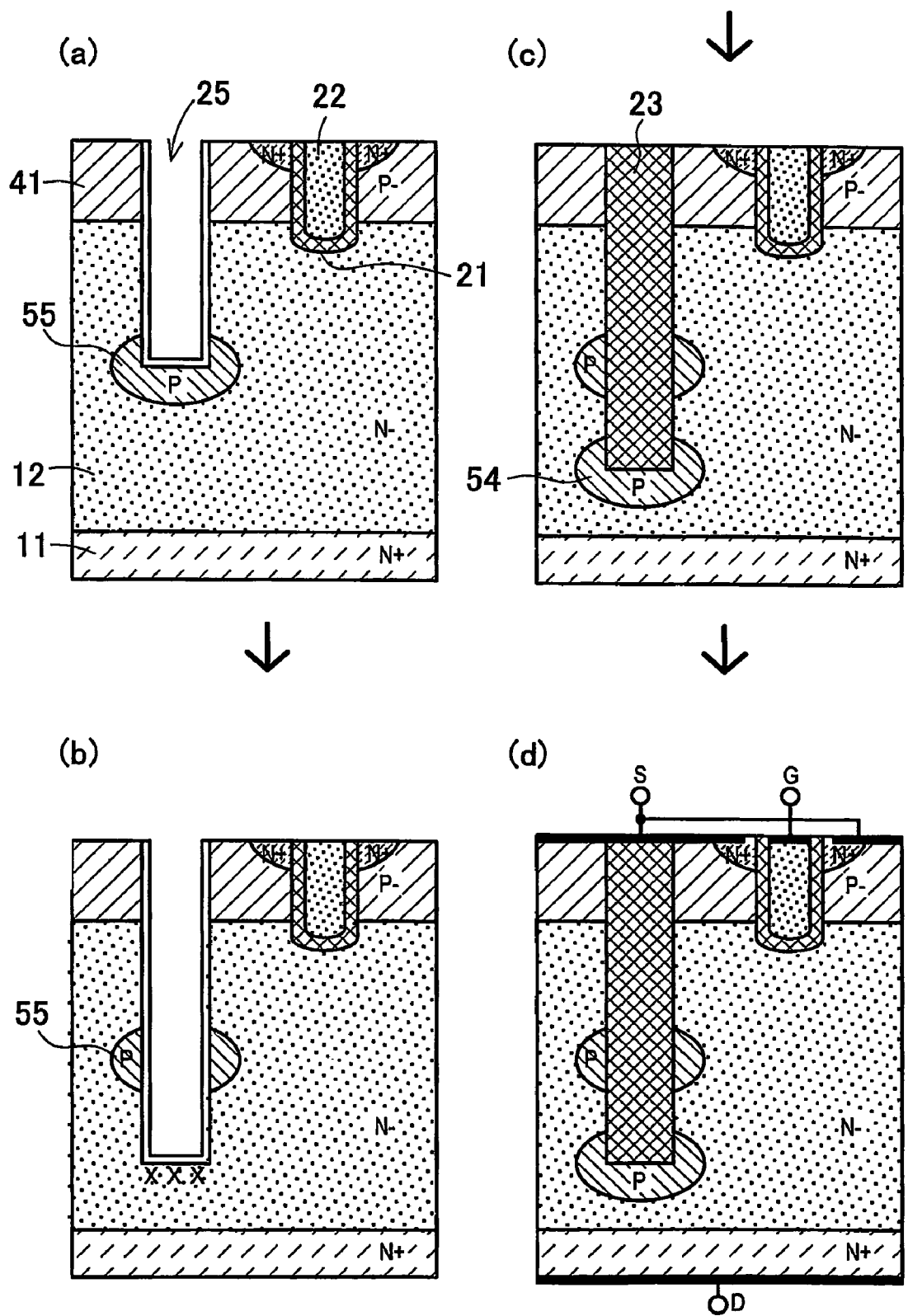
FIGS. 12(a)-12(d) illustrate manufacturing process of the insulated gate type semiconductor device directed to FIG. 8.

The manufacturing process of the semiconductor device 201 shown in FIG. 8 is explained by referring to FIG. 12. The gate electrode 22 and gate trench 21 of the semiconductor device 201 have a general structure and formed by known manufacturing method. As shown in FIG. 12(*a*), a trench 25 is formed by penetrating through the P– body region and with its bottom reaching up to the N– drift region 12. Next, ion implantation from the bottom of the trench 25 is made. After that, thermal diffusion process is conducted. As a result, P floating region 55 is formed. In this state, on the basis of the semiconductor substrate, insulating material is deposited in the trench 25, and source electrode and drain electrode are formed, and then the semiconductor device 200 as shown in FIG. 7 is fabricated.

By etching again as shown in FIG. 12(*b*), the trench 25 is excavated. From the bottom of the trench 25, ion implantation is executed again. As shown in FIG. 12(*c*), an insulating material 23 is deposited in the gate trench 21 by CVD. Later, for the purpose of annealing of the insulating material and formation of the P floating region 54, thermal diffusion process is carried out. As a result, the P floating region 54 is formed. Then, by forming the source electrode and drain electrode, the insulated gate type semiconductor device, that is, semiconductor device 201 as shown in FIG. 12(*d*) is fabricated.

THIRD EMBODIMENT

Figure 13:
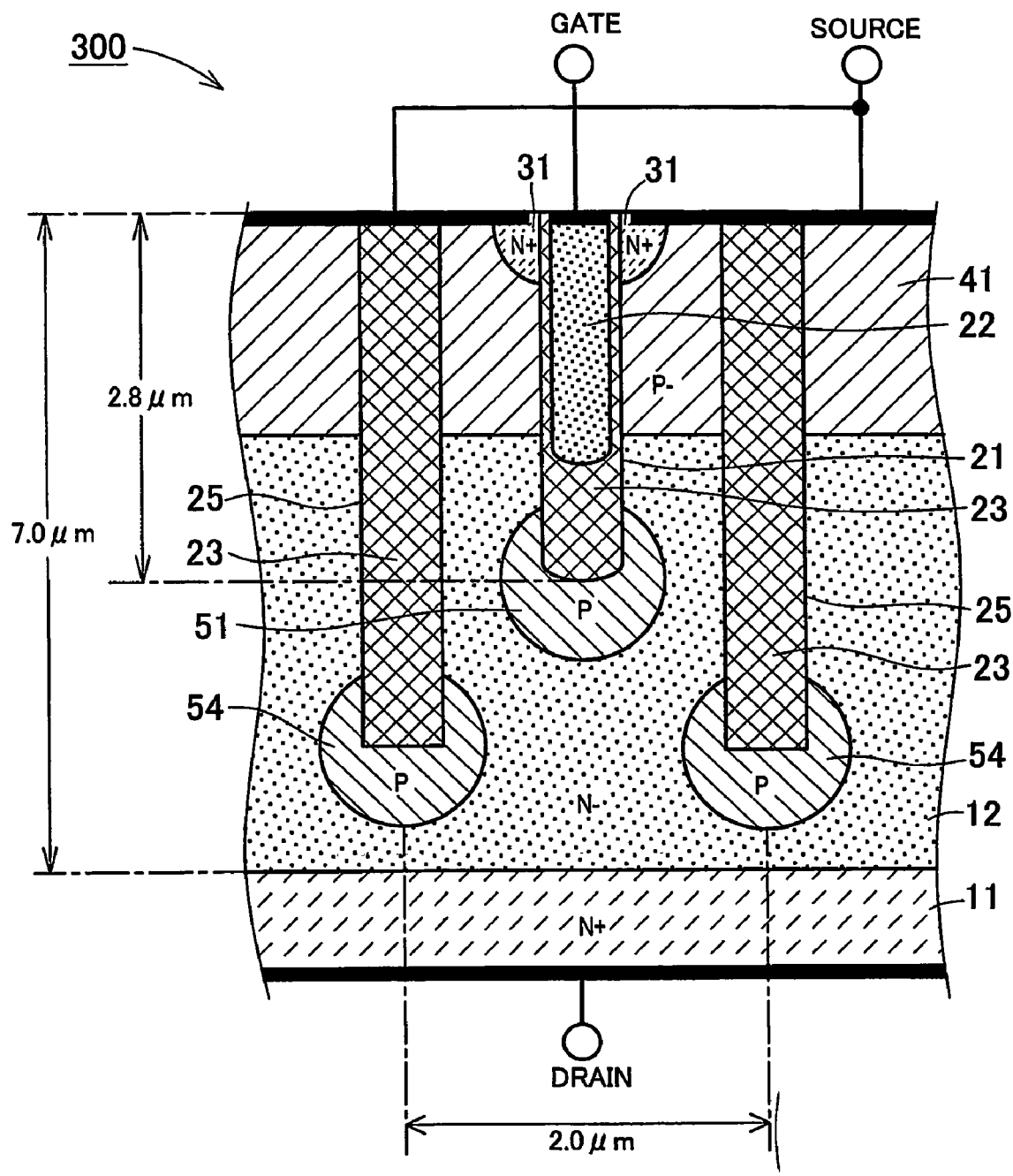
FIG. 13 is a sectional view showing structure of an insulated gate type semiconductor device directed to a third embodiment.

An insulated gate type semiconductor device 300 (hereinafter called semiconductor device 300) in a third embodiment has a structure as shown in a sectional view in FIG. 13. It is a feature of the semiconductor device 300 in this embodiment is that the P floating region is provided individually beneath a trench for gate electrode, and a trench for P floating region, that is, trench not incorporating the gate electrode. In this respect, it is different from the semiconductor device 100 (see FIG. 1) having the P floating region provided only beneath the gate trench 21 for gate electrode, or the semiconductor device 200 (see FIG. 7) provided only beneath the trench 25 for P floating region. In FIG. 13, constituent elements having same reference numerals as in the semiconductor device 100 shown in FIG. 1 and the semiconductor device 200 shown in FIG. 7 have same functions The semiconductor device 300, same as the semiconductor device 100 of the first embodiment and the semiconductor device 200 of the second embodiment, comprises N+ source region 31, N+ drain region 11, P– body region 41 and N– drift region 12. By excavating part of the upper side of the semiconductor device 300, a gate trench 21 is formed. In the bottom of the gate trench 21, a deposited insulating layer 23 is formed by depositing an insulating material. Further on the deposited insulating layer 23, a gate electrode 22 is formed. The gate electrode 22 is insulated from the P– body region 41 by the gate dielectric 24 formed on the wall of the gate trench 21. In the semiconductor device 200, by application of voltage to the gate electrode 22, a channel effect is produced in the body region 41, and thereby the conduction between the N+ source region 31 and N+ drain region 11 is controlled.

The semiconductor substrate has trenches 25, 25 deeper than the gate trench 21 at both sides of the gate trench 21, in addition to the gate trench 21 incorporating the gate electrode 22. The trench 25 is filled with insulating material. Further, being surrounded by an N– drift region 12, P floating regions 51, 54 are formed. The section of the P floating regions 51, 54 is a nearly circular shape centered on the bottom of the trench 25 as shown in a sectional view in FIG. 13. In this specification, the P floating region in which the bottom of the gate trench 21 for gate electrode is positioned is called the "P floating region 51", and the P floating region in which the bottom of the gate trench 25 for P floating region is positioned is called the "P floating region 54".

The adjacent P floating regions 51, 54 are disposed so as not to contact with each other. If the adjacent P floating regions contact with each other, the current path in ON time is narrow, and the on-resistance increases. The P floating region 51 is disposed at a limit position of the depletion layer, which spreads downward from the PN junction of the P– body region 41 and N– drift region 12 in OFF time, reaches up to the P floating region 51 before occurrence of breakdown. This is because the withstand voltage is proportional to the depth of the depletion layer, and the withstand voltage becomes lower if the distance between the P– body region 41 and P floating region 51 is short. The P floating region 54 is disposed at a limit position of the depletion layer, which spreads downward from the P floating region 51, reaches up to the P floating region 54 before occurrence of breakdown. This is also intended to realize an optimum high withstand voltage design.

In the semiconductor device 300 of the embodiment, P floating regions 51, 54 are provided in both bottom of the gate trench 21 for gate electrode, and the bottom of the trench 25 for P floating region, and further the gate trench 21 and trench 25 are different in depth, and therefore the peak of electric field is formed at three positions, same as the semiconductor device 201 shown in FIG. 8 or semiconductor device 202 shown in FIG. 9. Hence both higher withstand voltage design and lower on-resistance design are realized.

Figure 14:
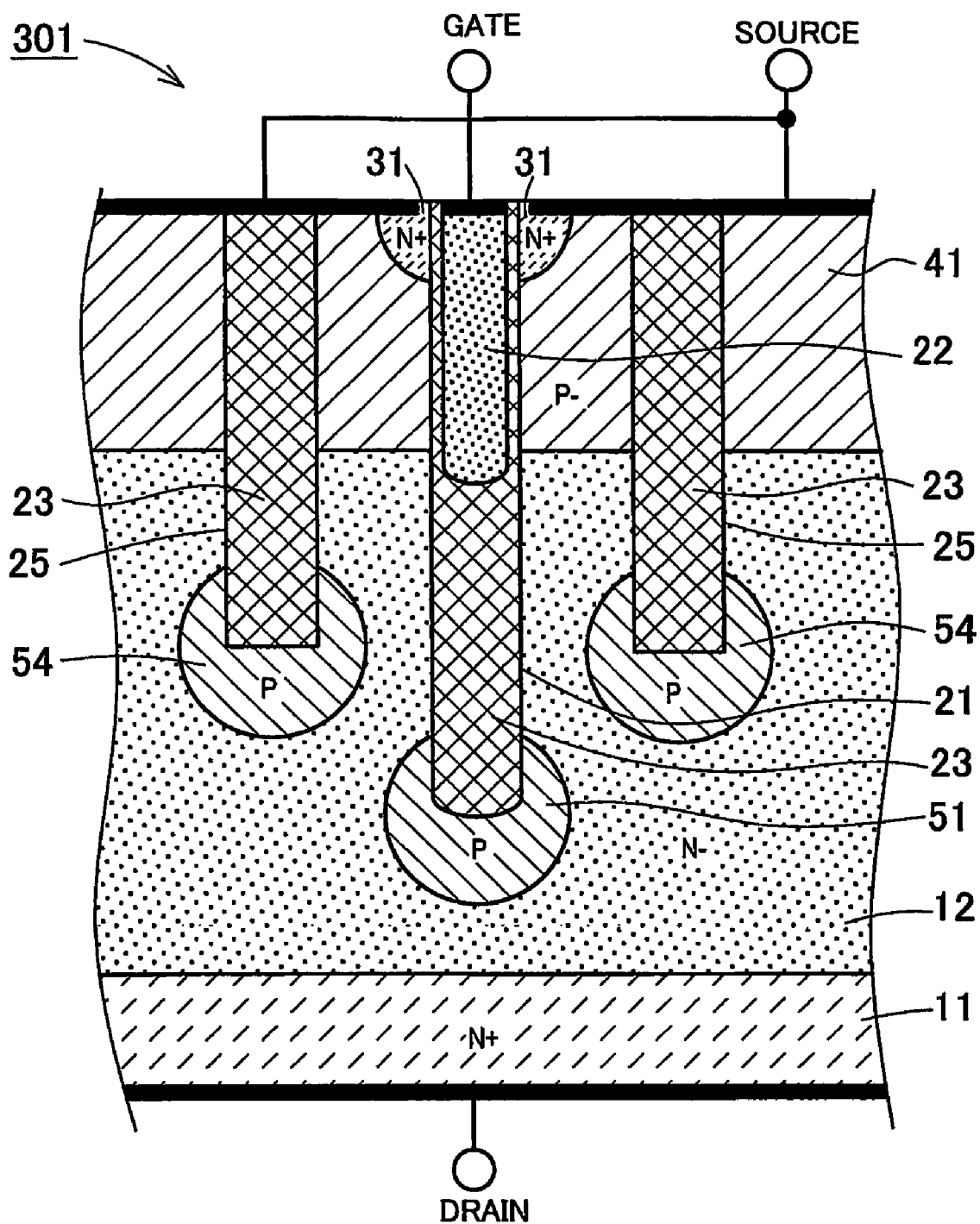
FIG. 14 is a sectional view showing structure of the insulated gate type semiconductor device (P floating region different in position of thickness direction) directed to the third embodiment.

The P floating regions 51, 54 are not limited to the layout of the upper P floating region 51 and lower P floating region 54 as in the semiconductor device 300 shown in FIG. 13. For example, as shown in FIG. 14, the P floating region 51 may be lower and the P floating region 54 may be upper. In the semiconductor device 301 having such layout, the peak of electric field is formed at three positions, and the maximum peak value can be decreased.

Figure 15:
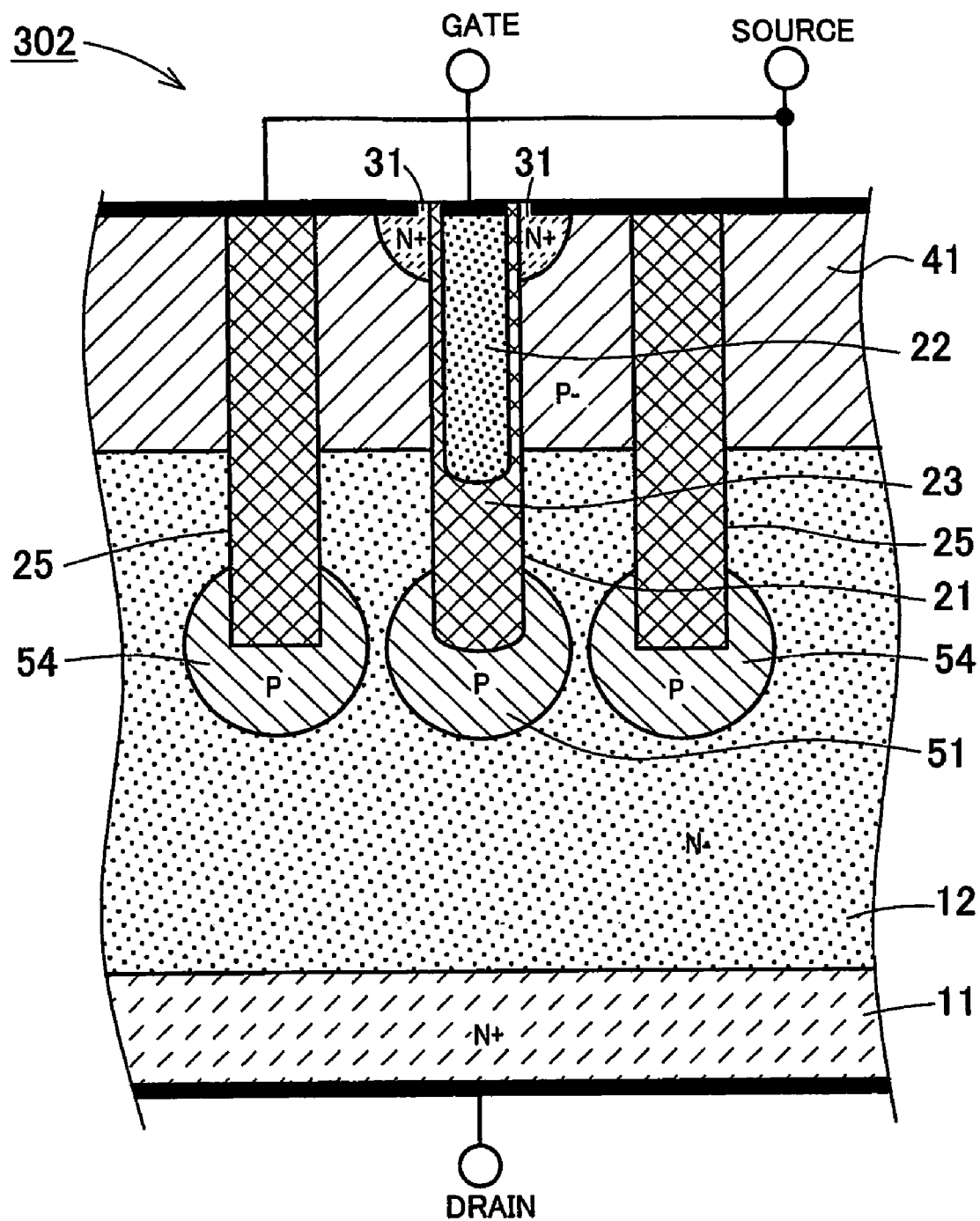
FIG. 15 is a sectional view showing structure of the insulated gate type semiconductor device (P floating region same in position of thickness direction) directed to the third embodiment.

Different from the semiconductor devices shown in FIG. 13 and FIG. 14, in the semiconductor device 302 shown in FIG. 15, the gate trench 21 for gate electrode and the trench 25 for P floating region may be formed in a same depth. Such semiconductor device 302 brings about the following benefits. That is, since the both trenches can be formed in a same process, the number of processes can be curtailed. Moreover, the distance of adjacent P floating regions is short, and if the concentration of N– drift region 12 is high, the depletion layer can be linked securely. Hence, lower on-resistance design can be realized. Since higher withstand voltage design is realized by multiple P floating regions 51, 54, the size of each one of P floating regions 51, 54 may be small. Hence, the acceleration voltage in ion implantation can be lowered, and damage by ion implantation can be suppressed. As compared with the semiconductor device having different trench depths, the thickness of the epitaxial layer may be smaller. Since the number of times of thermal diffusion processing is smaller, diffusion of impurity can be suppressed, and the increase of on-resistance due to thermal diffusion processing can be suppressed.

Figure 16:
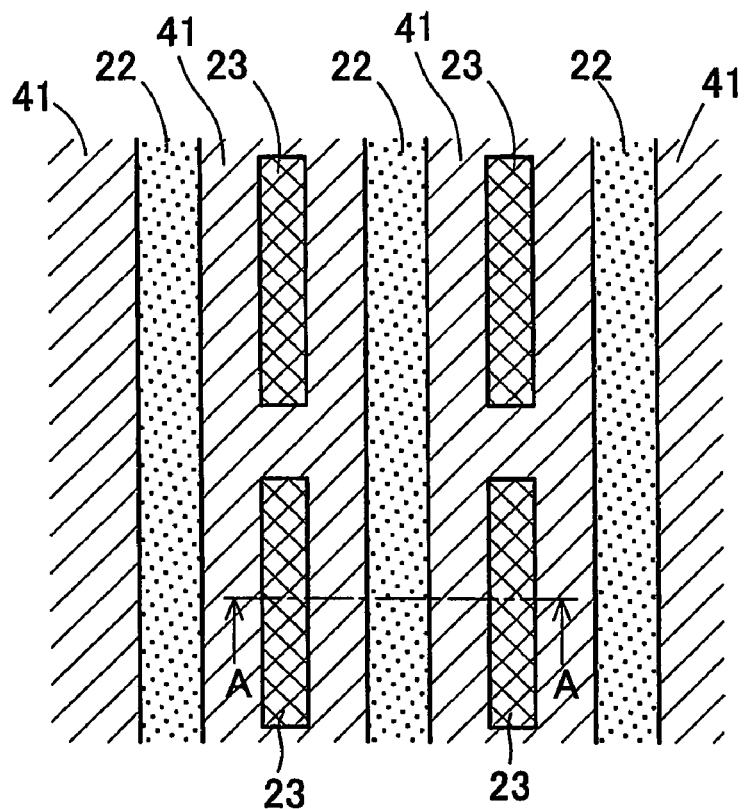
FIG. 16 is a top view showing array (1) of an insulated gate type semiconductor device with dot-patterned trench.
Figure 17:
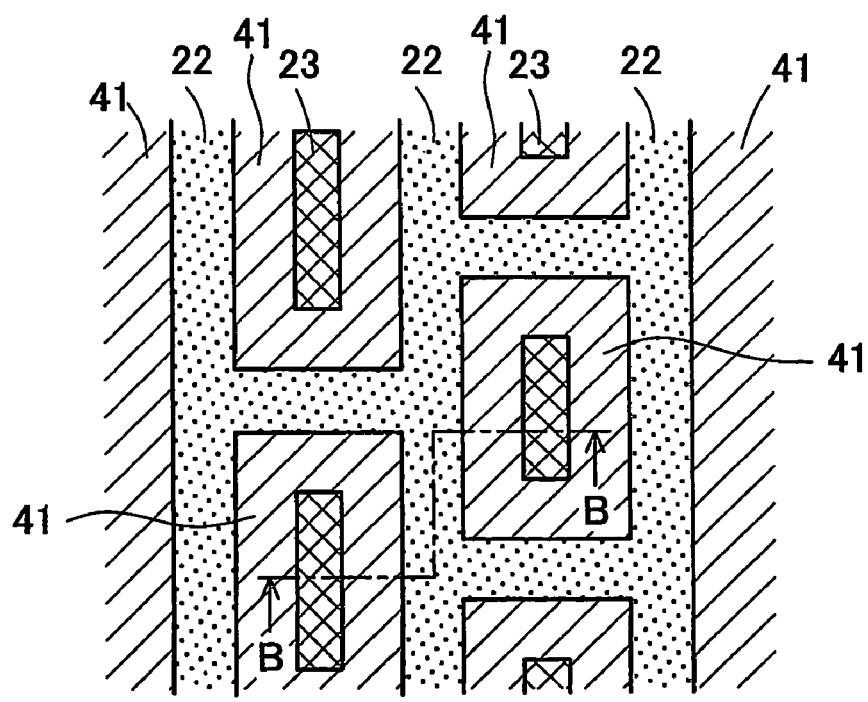
FIG. 17 is a top view showing array (2) of an insulated gate type semiconductor device with dot-patterned trench.

The shape of trenches of the semiconductor device 302 shown in FIG. 15 may be any shape, same as in the other semiconductor devices, including stripe shape (see FIG. 10), mesh shape (see FIG. 11), and dot shape. Since the density of each P floating region is high in the semiconductor device 302, as compared with other structure, the manufacturing margin of size and others is wider. By making use of this merit, the trench 25 may be formed in dot shape as shown in FIG. 16. In this layout, since the P floating region 54 is partially cut away, the current path is broad, and a lower on-resistance design is realized. To make uniform the spread of depletion layer, the distance of trenches is set uniform. Furthermore, as shown in FIG. 17, a gate trench 21 is formed at cut segment of trench 25 to form in a mesh, and the area of the gate electrode 22 is wider, and a lower on-resistance design is realized. Section A-A in FIG. 16 or section B-B in FIG. 17 corresponds to the semiconductor device 302 in FIG. 15.

Figure 18:
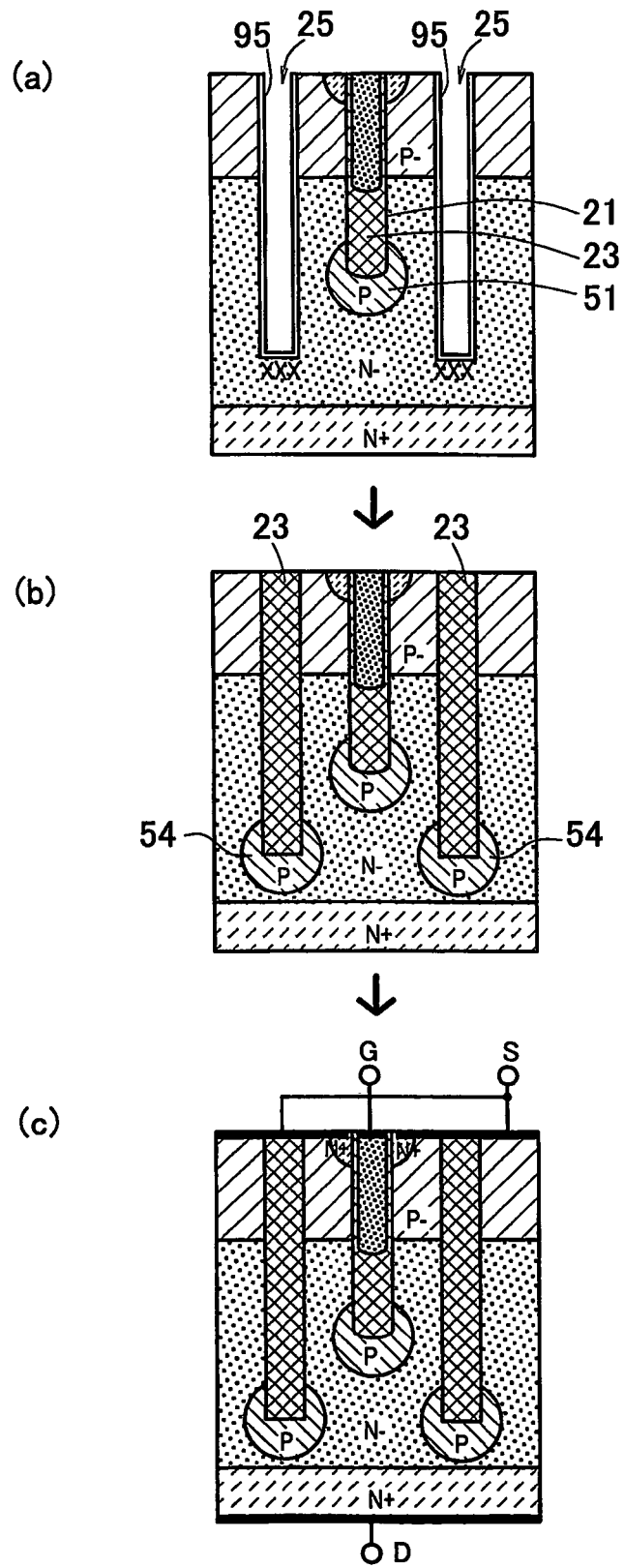
FIGS. 18(a)-18(c) illustrate manufacturing process of the insulated gate type semiconductor device directed to FIG. 13.

The manufacturing process of the semiconductor device 300 shown in FIG. 13 is explained by referring to FIG. 18. The gate electrode 22 and gate trench 21 of the semiconductor device 300 have a same structure as in the semiconductor device 100 in FIG. 1, and formed in the same manufacturing method as the manufacturing method shown in FIG. 3. First, by etching as shown in FIG. 18(a), a trench 25 deeper than the gate trench 21 is formed. By the subsequent thermal oxidation processing, an oxide film 95 is formed on the wall of the trench 25. Ion implantation is executed again from the bottom of the trench 25. After ion implantation, the oxide film 95 in the trench 25 is removed. When burying the oxide film, if there is problem of interface state, or it is better for burying the insulating material when a thin oxide film is formed on the silicon surface, it is better to form a thin thermal oxide film of about 50 nm and then bury the insulating material. Such process is not needed if it is better for burying the insulating material when the silicon surface is exposed.

Further, an insulating material is deposited in the trench. Later, for the purpose of annealing of the insulating material and formation of the P floating region 54, thermal diffusion processing is carried out. As a result, the P floating region 54 is formed at a different position in the thickness direction from the P floating region 51. As shown in FIG. 18(b), a deposited insulating layer 23 is formed in the trench 25. Then, by forming the source electrode and drain electrode, the insulated gate type semiconductor device, that is, the semiconductor device 300 as shown in FIG. 18(c) is fabricated. The semiconductor device 301 shown in FIG. 14 can be fabricated in the same process only by varying the depth of the trenches.

In this manufacturing process, the gate trench 21 is formed before the trench 25, and it is intended to decrease the thermal load. However, the trench 25 may be formed earlier by lowering the gate oxidation temperature.

Figure 19:
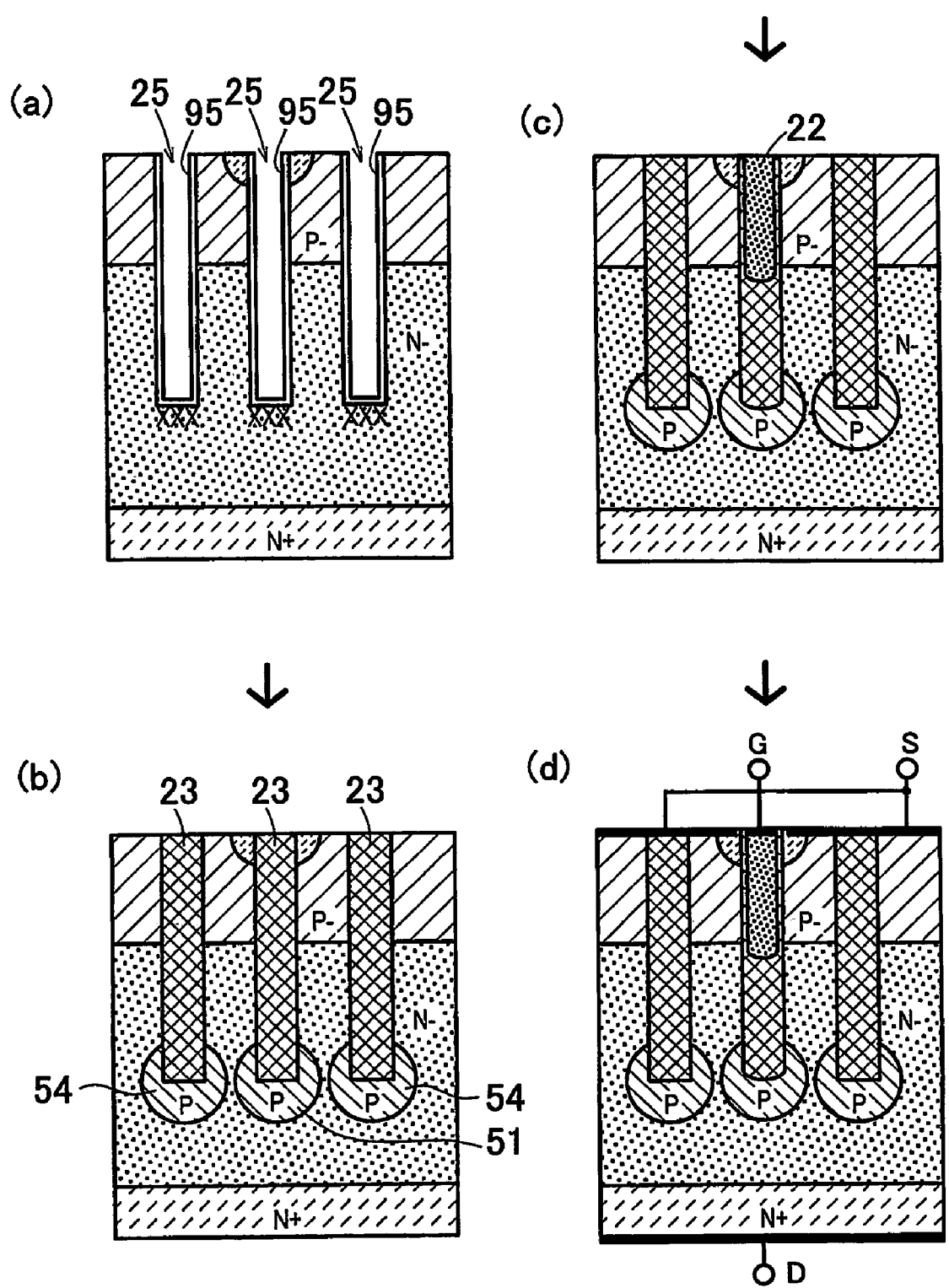
FIGS. 19(a)-19(d) illustrate manufacturing process of the insulated gate type semiconductor device directed to FIG. 15.

The manufacturing process of the semiconductor device 302 shown in FIG. 15 is explained by referring to FIG. 19. First, as shown in FIG. 19(a), penetrating through the P− body region 41, a gate trench 21 and trench 25 are formed until its bottom reaches up to the N− drift region 12. The both trenches are formed at the same time, and hence same in the depth. By subsequent thermal oxidation processing, an oxide film 95 is formed on the wall of each trench. Ion implantation is executed from the bottom of each trench. After ion implantation, the oxide film 95 of each trench is removed. When burying the oxide film, if there is problem of interface state, or it is better for burying the insulating material when a thin oxide film is formed on the silicon surface, it is better to form a thin thermal oxide film of about 50 nm and then bury the insulating material. Such process is not needed if it is better for burying the insulating material when the silicon surface is exposed.

Further, an insulating material is deposited in each trench. As a result, a deposited insulating layer 23 is formed in each trench. Later, for the purpose of annealing of the insulating material and formation of the P floating region 51 and P floating region 54, thermal diffusion processing is carried out. As a result, the P floating region 51 and P floating region 54 are formed simultaneously by one thermal diffusion processing. As a result, as shown in FIG. 19(b), the P floating region 51 is formed beneath the gate trench 21 and the P floating region 54 beneath the trench 25.

By etching the deposited insulating layer 23 in the gate trench 21, part of the deposited insulating layer 23 is removed. Further, an oxide film 24 is formed by thermal oxidation on the wall of the gate trench 21. This is the gate oxide film 24. By depositing a conductor in the gate trench 21, a gate electrode 22 incorporated in the gate trench 21 is formed as shown in FIG. 19(c). Then, by forming the source electrode and drain electrode, the insulated gate type semiconductor device, that is, semiconductor device 302 as shown in FIG. 19(d) is fabricated.

FOURTH EMBODIMENT

An insulated gate type semiconductor device 400 (hereinafter called semiconductor device 400) in a fourth embodiment has a structure as shown in a sectional view in FIG. 20. The semiconductor device 400 has a different terminal structure from the conventional semiconductor device. The semiconductor device 400 of this embodiment, same as the semiconductor device 100 of the first embodiment, comprises N+ source region 31, N+ drain region 11, P− body region 41, N− drift region 12, and gate trench 21 incorporating gate electrode 22. By application of voltage to the gate electrode 22, the conduction between the N+ source region 31 and N+ drain region 11 is controlled. In this specification, in the periphery of the cell region (cell area), a region acting as a terminal end is called a "terminal area".

Figure 20:
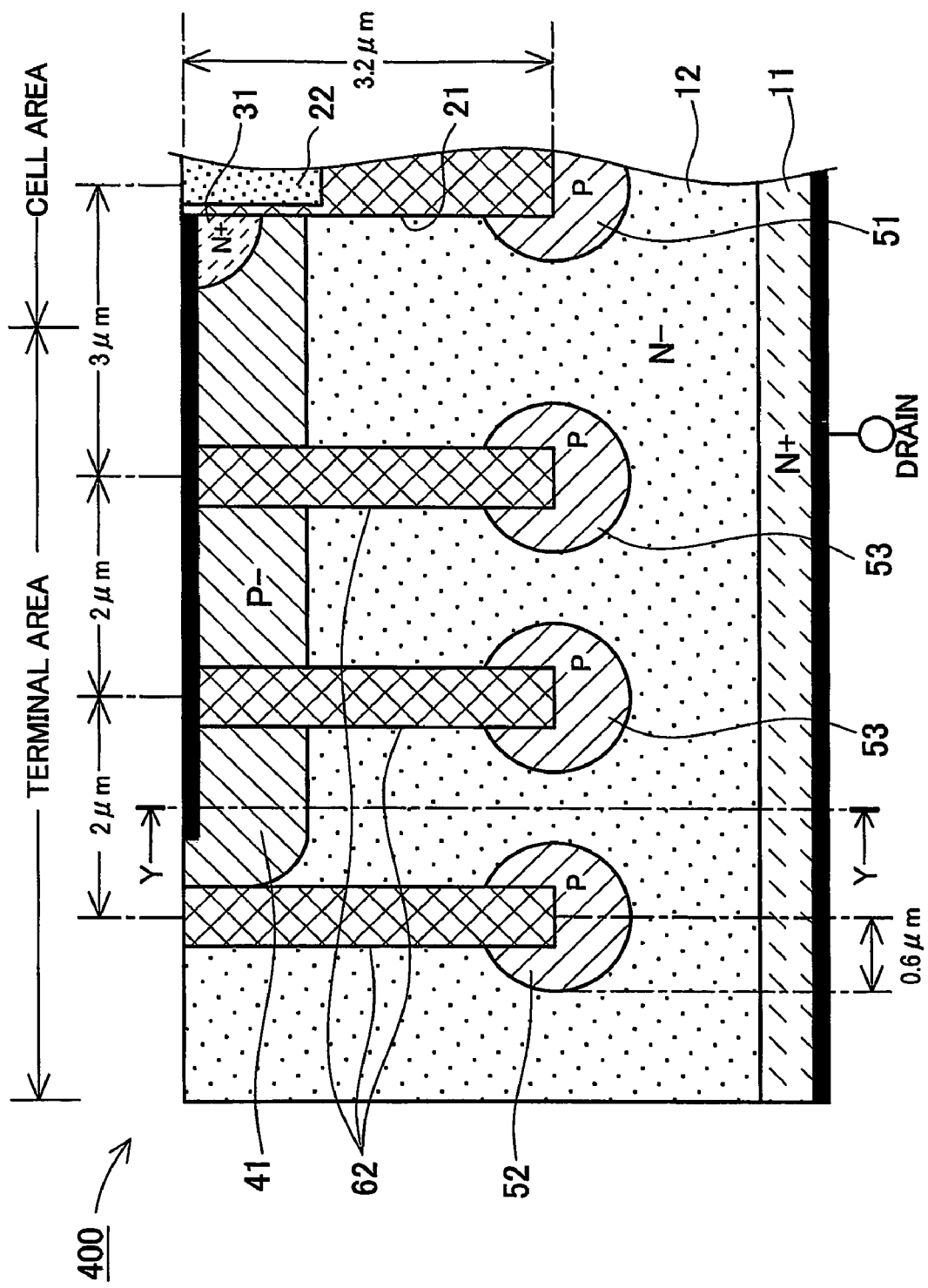
FIG. 20 is a sectional view showing terminal structure of an insulated gate type semiconductor device directed to a fourth embodiment.
Figure 21:
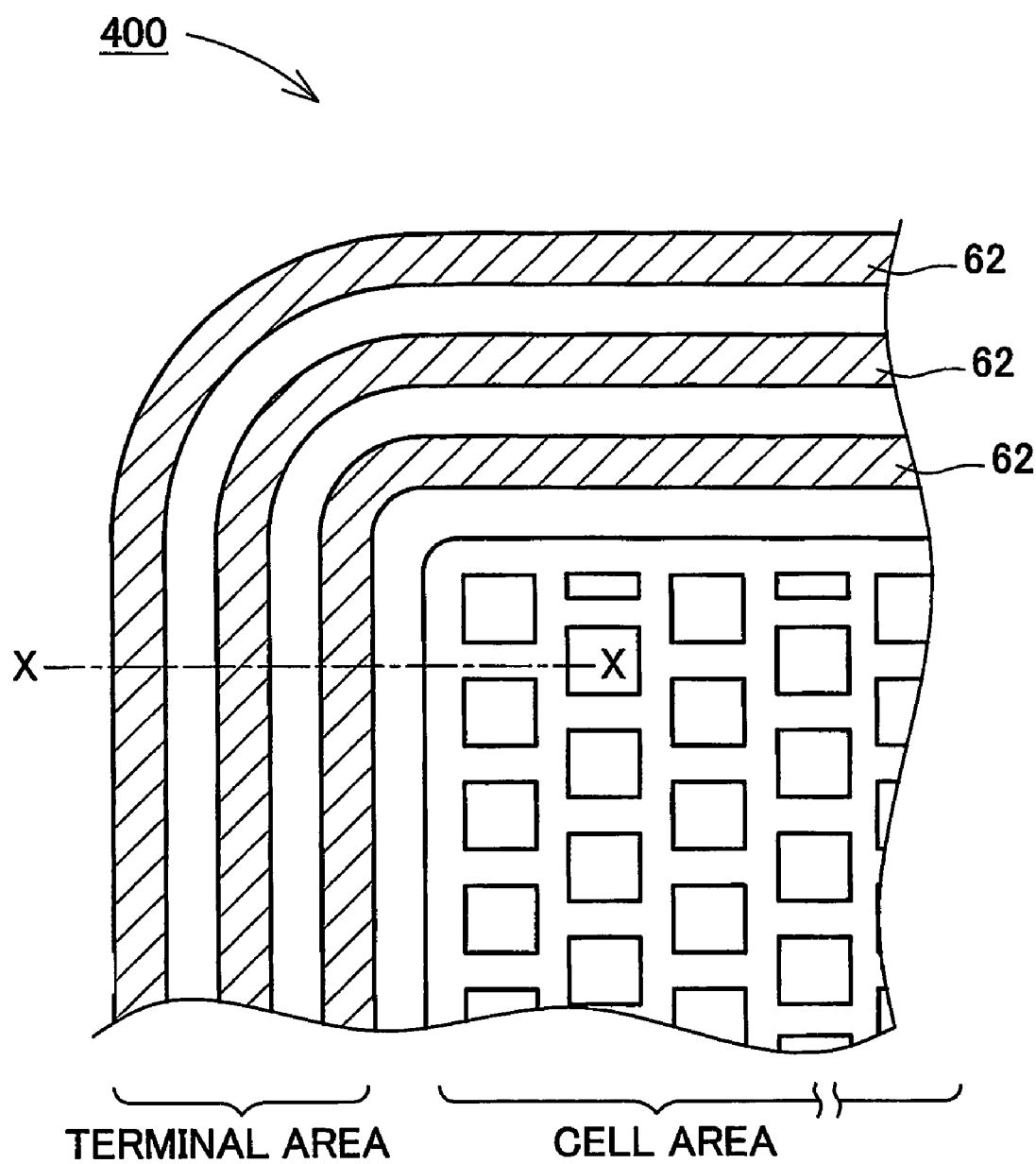
FIG. 21 shows layout of the semiconductor device directed to FIG. 20, viewed from top.

In the terminal area of the semiconductor device 400, as shown in FIG. 21, a terminal trench 62 is formed so as to surround the cell area. The inside of the terminal trench 62 shown in FIG. 20 is entirely filled with an insulating material (silicon oxide or the like). Beneath the terminal trench 62, a P floating region 53 having the same action as the P floating region 51 in the first embodiment is formed.

Figure 22:
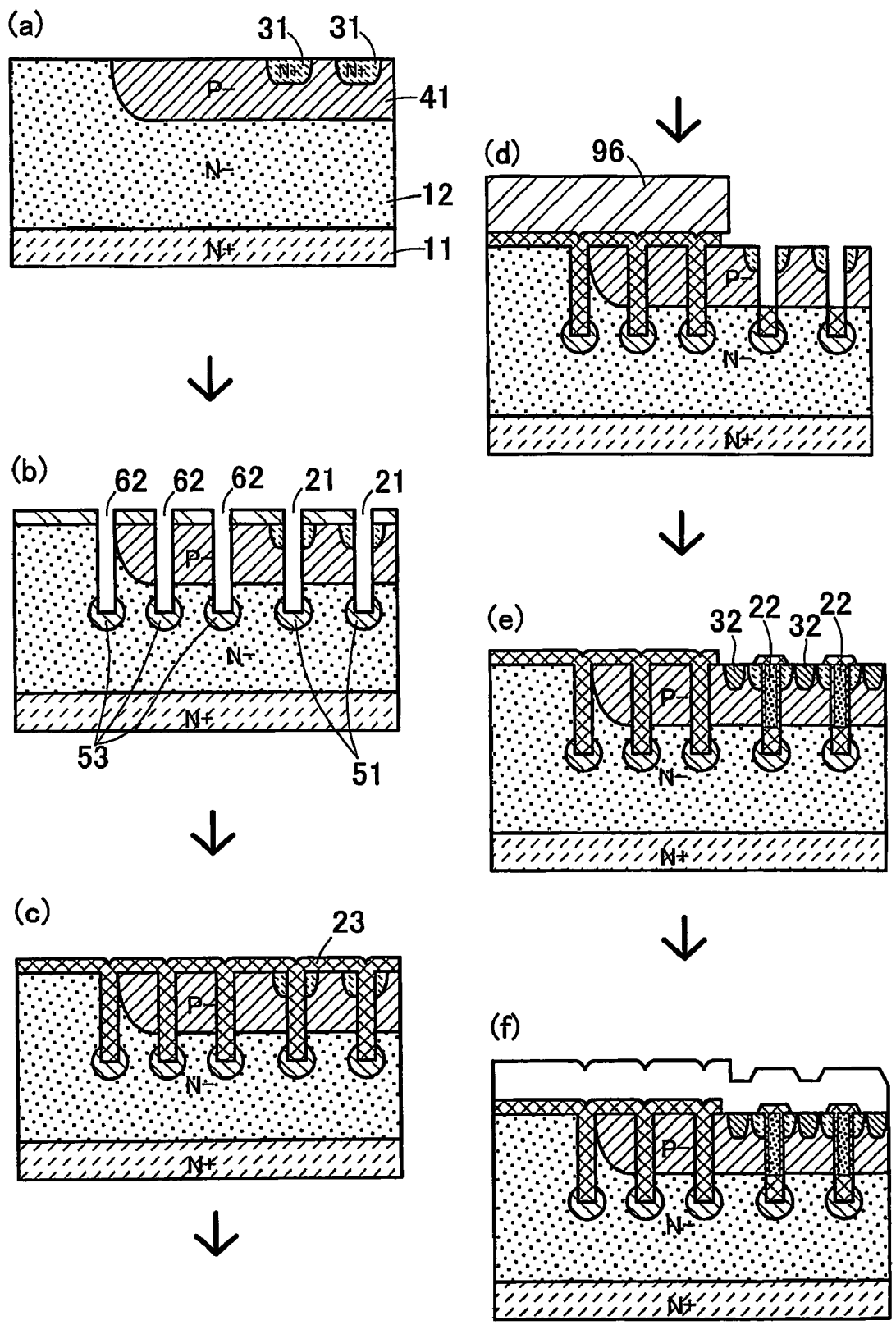
FIGS. 22(a)-22(f) illustrate manufacturing process of the insulated gate type semiconductor device directed to FIG. 20.

The manufacturing process of the semiconductor device 400 is explained below, mainly relating to the terminal area, by referring to FIG. 22. First, as shown in FIG. 22(a), an epitaxial layer (N− drift region 12, body region 41, N+ source region 31) is formed on the N+ drain region 11. The detail is same as in the first embodiment. Then a gate trench 21 is formed on the semiconductor substrate. At this time, the terminal trench 62 is also formed in the terminal area simultaneously. As shown in FIG. 22(b), by ion implantation from the bottom, P floating regions 51, 53 are formed.

As shown in FIG. 22(c), by depositing an insulating material in each trench, a deposited insulating layer 23 is formed. As shown in FIG. 22(d), a resist 96 is formed on the terminal area of the top of the semiconductor substrate. Using the resist 96 as the mask, the insulating material is etched. As a result, the height of the deposited insulating layer 23 is adjusted. At this time of etching, the deposited insulating material in the terminal area is protected by the resist 96. Hence, only the deposited insulating material in the cell area is adjusted in height. Therefore, the insulating material in the terminal trench 62 is not removed at all, and the terminal trench 62 remains to be filled up. After height adjustment of the deposited insulating material, the resist 96 is removed.

As shown in FIG. 22(e), an oxide film is formed on the top of the semiconductor substrate and wall of the gate trench 21, and a conductor 22 is deposited in the gate trench 21. As a result, a gate electrode 22 is formed in the gate trench 21. As required, a P+ source region 32 may be further formed. Then, by forming the source electrode and drain electrode, the insulated gate type semiconductor device, that is, semiconductor device 400 as shown in FIG. 22(f) is fabricated.

Figure 23:
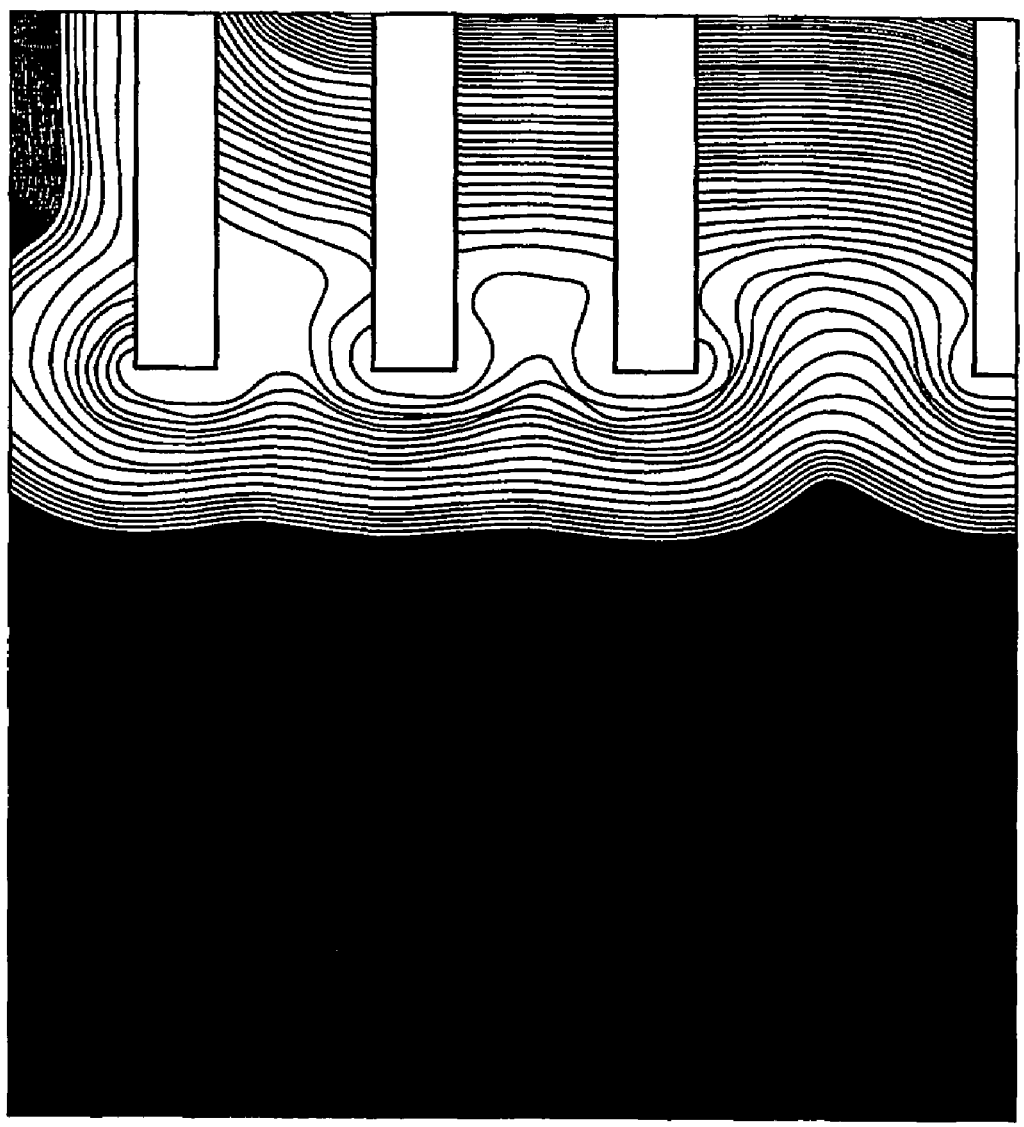
FIG. 23 shows potential distribution at X-X section in the semiconductor device directed to FIG. 21.
Figure 24:
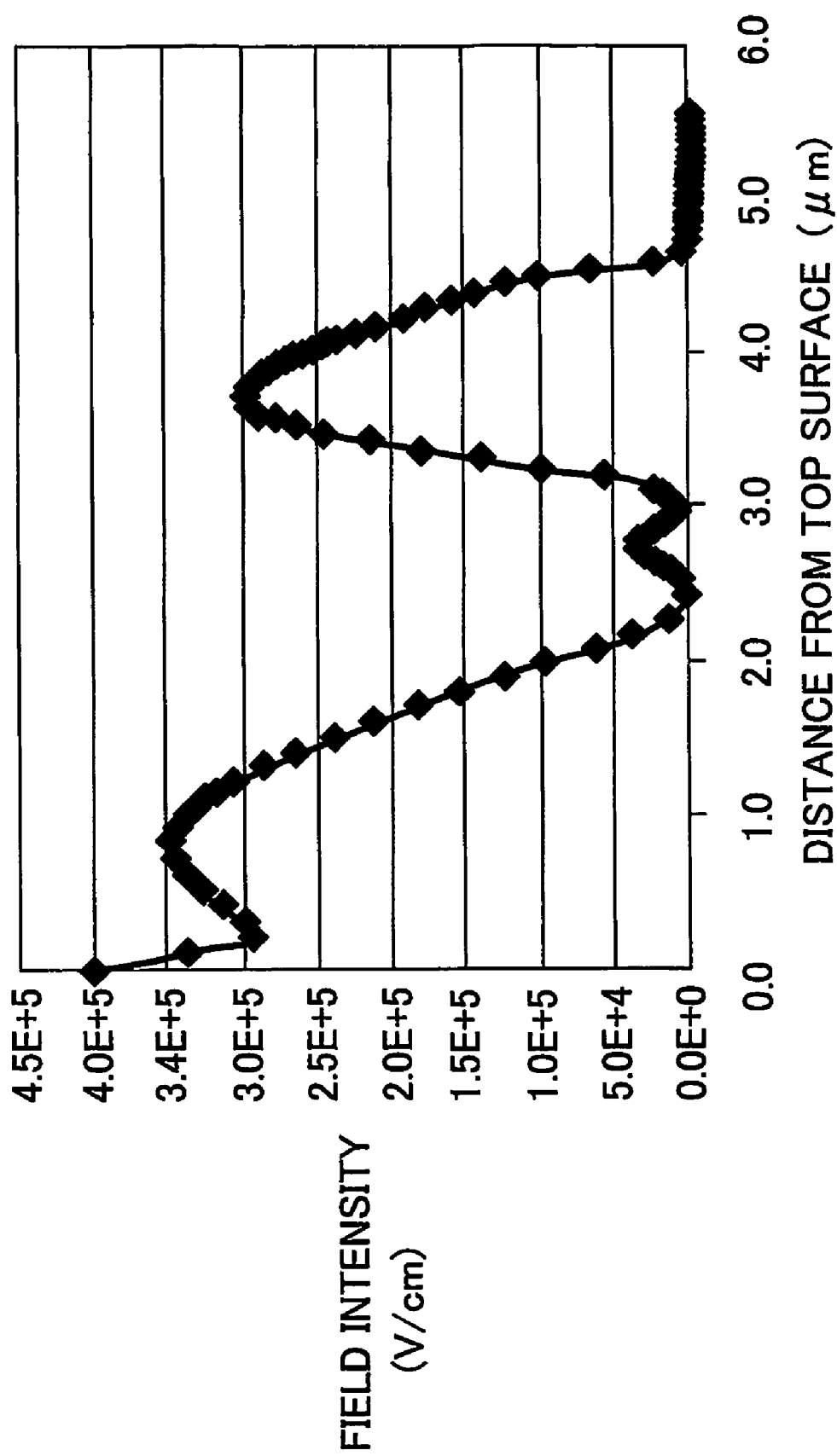
FIG. 24 is a graph showing field intensity at Y-Y section in the semiconductor device directed to FIG. 20.

Simulation results of field intensity of the semiconductor device 400 are explained. In this simulation, the field intensity distribution of section X-X in FIG. 21 was determined. FIG. 23 shows isopotential lines in the semiconductor device 400. As shown in FIG. 23, the peak of electric field are present at two positions, that is, near the PN junction of the P− body region 41 and N− drift region 12, and the lower end of the P floating region 52. The graph in FIG. 24 shows the field intensity in the Y-Y section of FIG. 20. The axis of ordinates represents the field intensity (V/cm), and the axis of abscissas denotes the distance (μm) from the top of the semiconductor substrate. The field intensity at Y-Y section shows the peak at two positions, that is, about 1.5 μm and 3.5 μm from the top surface as shown in FIG. 24. As known from the graph, too, the electric field reaches the peak near the PN junction of the P− body region 41 and N− drift region 12, and at the lower end of the P floating region 52. It is thus known that the concentration of electric field is alleviated in the terminal area, as well as in the cell area.

Figure 32:
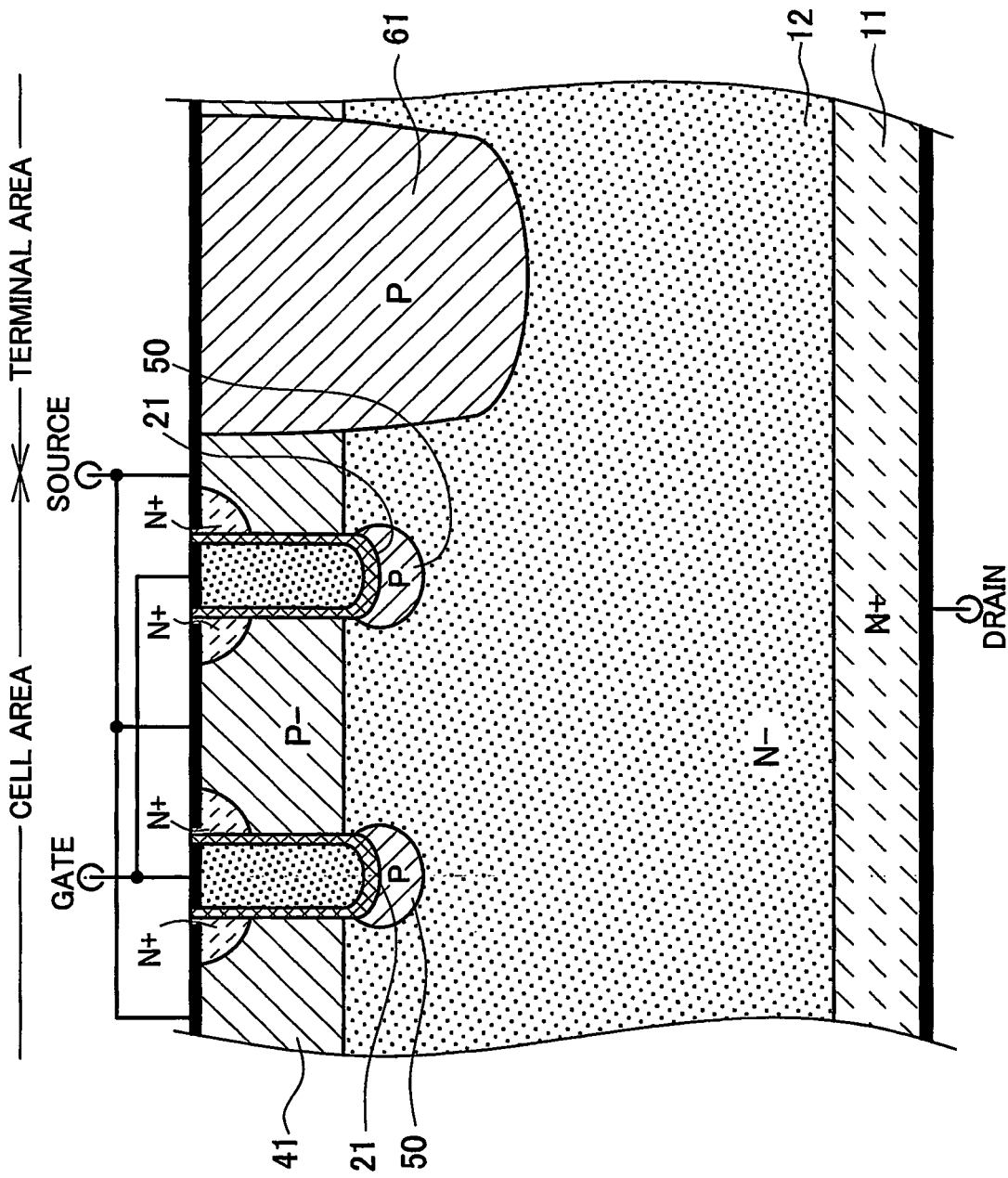
FIG. 32 is a sectional view showing terminal structure of a conventional insulated gate type semiconductor device.

The semiconductor device 400 of the embodiment realizes a higher withstand voltage designed by the terminal trench 62 and corresponding P floating region 52. As a result, as compared with the conventional insulated gate type semiconductor device shown in FIG. 32, the following features are provided. That is, in the semiconductor device 400 of the embodiment, the P floating region 53 of the terminal area can be fabricated in the same process as the P floating region 51 of the cell area, and hence the number of processes is reduced and it is easy to fabricate. The P floating region 53 is smaller in thermal load as compared with the P terminal diffusion region 61. Hence, the N− drift region 12 (epitaxial layer) can be formed in a smaller thickness, and the on-resistance can be decreased. The size of the P floating region 53 is smaller than in the conventional P terminal diffusion region 61. Hence, the size can be controlled easily.

In the semiconductor device 400, three terminal trenches 62 are formed, but the number of terminal trenches 62 is not limited. The greater the number of terminal trenches 62, the higher is the withstand voltage. For example, in the case of the semiconductor device 400, supposing the number of terminal trenches 62 to be one, the withstand voltage is 50 V. By contrast, by increasing the number of terminal trenches 62 to two, it is enhanced to 64 V, and by increasing to three, it is enhanced to 72 V. On the other hand, by increasing the number of trenches, the space of the terminal area becomes wider, which is contradictory to compact design of the entire semiconductor device. Hence, the terminal trench 62 is formed depending on the withstand voltage. The withstand voltage is enhanced by optimizing the interval between adjacent terminal trenches 62. Specifically, in the semiconductor device 400, as compared with the distance (3 μm) between gate trenches 21, the distance (2 μm) between the terminal trenches 62 is designed to be shorter. In the embodiment, the terminal trench 62 is formed in a slender groove, but it is not limited. For example, it may be formed like a hole.

As described herein, in the semiconductor device 100 of the first embodiment (FIG. 1), in single process of epitaxial growth, an epitaxial layer (N− drift region 12) is formed, and further by ion implantation and thermal diffusion, a P− body region 41 is formed in the epitaxial layer. A gate trench 21 is formed on the semiconductor substrate having this epitaxial layer, and by ion implantation from the bottom of the gate trench, a P floating region 51 is formed. That is, to form the P floating region 51, only one process of epitaxial growth is needed. This is the same when fabricating a plurality of P floating regions 52 in the thickness direction as in the semiconductor device 101 (FIG. 2), or when fabricating the P floating region 53 in the terminal area as in the semiconductor device 400 (FIG. 20). By the P floating region 51, depletion of the N− drift region 12 when switching off the gate voltage is promoted, and concentration of electric field can be alleviated. Hence, both higher withstand voltage design and lower on-resistance design are realized, and the easily fabricated insulated gate type semiconductor device and its manufacturing method are realized.

In the gate trench 21, a deposited insulating layer 23 may be formed. As a result, without receiving effects from the ion implantation, the gate dielectric 24 and gate electrode 22 can be formed. Hence, deterioration of device characteristic and decline of reliability can be suppressed. The upper end of the deposited insulating layer 23 is positioned higher than the upper end of the P floating region 51. Hence, confrontation of the gate electrode 22 and P floating region 51 can be inhibited. Hence, increase of on-resistance can be prevented.

In the semiconductor device 101 (FIG. 2), a P floating region 52 is formed between the P− body region 41 and P floating region 51. As a result, the peak of electric field is formed at three positions, and the maximum peak value can be further decreased. Hence, by forming the P floating region 52, the higher withstand voltage design and lower on-resistance design can be realized.

In the semiconductor device 200 of the second embodiment (FIG. 7), a trench 25 for P floating region is provided. That is, the trench not incorporating the gate electrode 22 is provided. Beneath the gate trench 21 incorporating the gate electrode 22, on the other hand, P floating region is not provided. Hence, it is free from problems such as effects of ion implantation or increase of on-resistance. The P floating region 54 is provided beneath the trench 25 formed for P floating region. It is hence not necessary to consider the position or size of the gate electrode 22, and the degree of freedom of design is enhanced. The distance between the gate electrode 22 and P floating region 54 is longer than in the first semiconductor device 100. Hence, same as in the semiconductor device 100 of the first embodiment, while assuring a higher withstand voltage design, it is easier to assure the current path and the lower on-resistance design can be realized.

In the semiconductor device 201 (FIG. 8), a P floating region 55 is formed between the P− body region 41 and P floating region 54. As a result, the peak of electric field is formed at three positions, and the maximum peak value can be further decreased. In the semiconductor device 202 (FIG. 9), trenches 25 of different depths are formed, and one P floating region 54 is provided beneath each trench. Hence, deterioration of characteristics by thermal diffusion processing can be kept to a minimum limit, and the higher withstand voltage design and lower on-resistance design can be realized.

In the semiconductor device 300 of the third embodiment (FIG. 13), a gate trench 21 for gate electrode and a trench 25 for P floating region are provided, and further P floating regions 51, 54 are provided beneath the both trenches. Further, the gate trench 21 and trench 25 are different in depth. As a result, the peak of electric field is formed at plural positions, and the maximum peak value can be further decreased.

In the semiconductor device 302 (FIG. 15), the gate trench 21 and trench 25 are formed in a same depth. Hence, the gate trench 21 and trench 25 can be formed in a same process. That is, the number of processes can be curtailed. Moreover, the thermal diffusion processing can be also conducted in the same process, and diffusion of impurity is less, and decline of on-resistance by thermal diffusion processing can be suppressed. Meanwhile, by "same depth," it does not mean exactly the same depth. Slight deviation in depth occurring during formation of trench is also included in the scope of same depth.

In the semiconductor device 400 of the fourth embodiment (FIG. 20), the terminal area also includes P floating region 53. Accordingly, a higher withstand voltage design can be achieved not only in the cell area but also in the terminal area. This P floating region 53 can be formed in the same process as the P floating region 51 in the cell area. Hence the terminal structure can be composed in a smaller number of processes. The P floating region 53 does not require wide space as compared with the conventional semiconductor device. Therefore, the size controllability is excellent, and the semiconductor device itself is compact.

The embodiments are mere examples, and are not intended to limit the scope of the invention. Therefore, the invention may be changed or modified freely within a scope not departing from the true spirit of the invention. For example, the regions of the semiconductors may be exchanged between P type and N type. The gate dielectric 24 is not limited to the oxide film, but may include nitride film, other insulating film or combination film. The semiconductor is not limited to silicon, but may include other types of semiconductor (SiC, GaN, GaAs, etc.).

In the semiconductor device 400 shown in FIG. 20, the trench 62 in the terminal area is completely filled with insulating material, but same as the gate trench 21 in the cell area, the conductor may be deposited by removing part of the insulating material. In this case, the conductor in the terminal trench 62 is not connected electrically to the gate wiring. Even in such semiconductor device, the higher withstand voltage design of the terminal area can be realized in a small number of processes.

Figure 25:
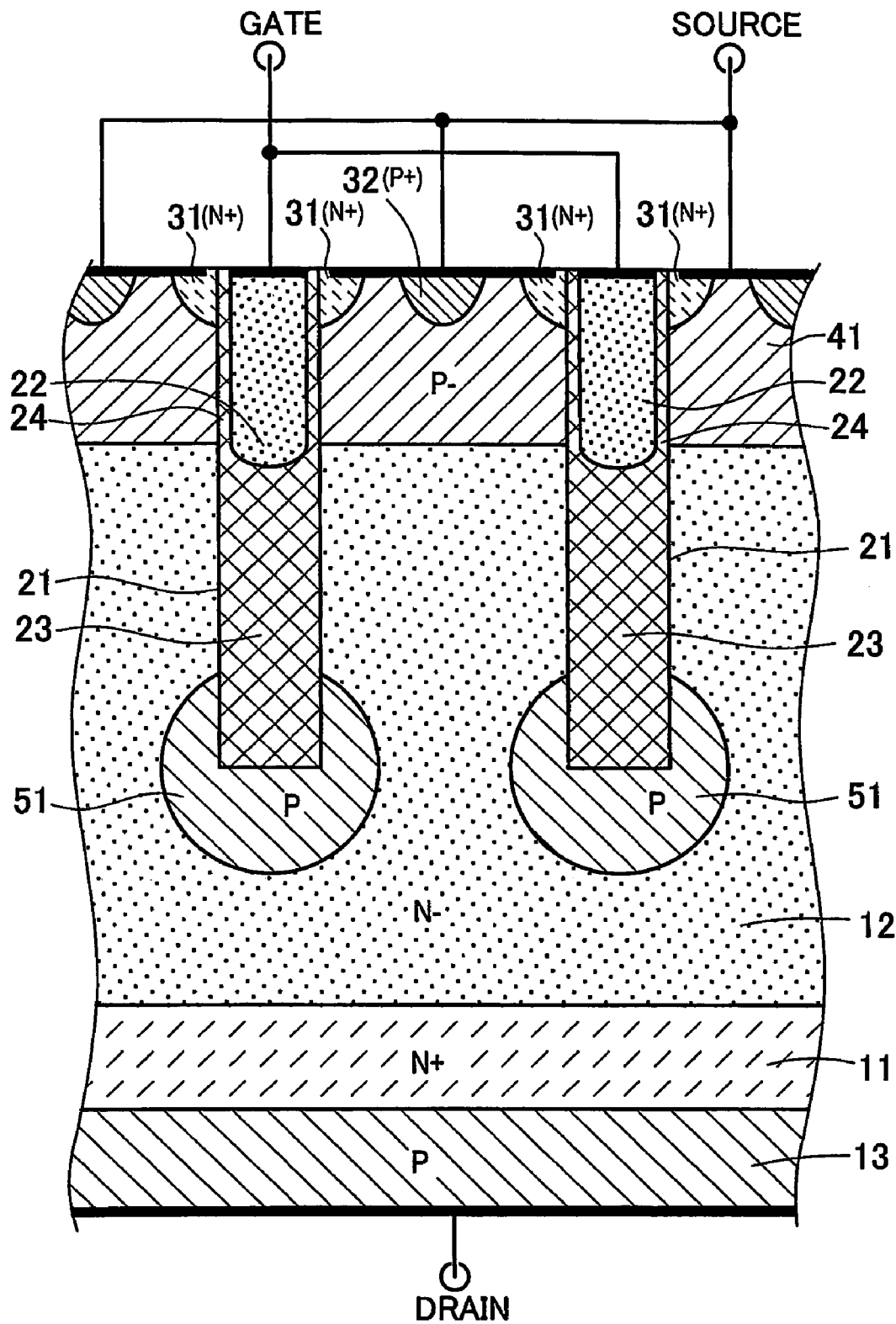
FIG. 25 is a sectional view showing structure of a conductivity-modulated type semiconductor device.

The insulated gate type semiconductor device of the invention can be applied also in the power MOS using the P type substrate 13 shown in FIG. 25 or the conductivity-modulated type power MOS.

The insulated gate type semiconductor device of the embodiments also has the following characteristics in addition to the characteristics described herein. That is, since holes are accumulated in the P floating region 51, the P floating region 51 becomes the supply source of holes. As a result, in the surface region of the N– drift region 12, specifically, in the region positioned higher than the P floating region 51, the hole concentration can be enhanced. As a result, the loss can be reduced. Moreover, since the deposited insulating layer 23 is formed beneath the gate electrode 22, the gate-drain capacity (Cgd) is small. Hence, transmission failure or driving loss can be decreased.

Figure 26:
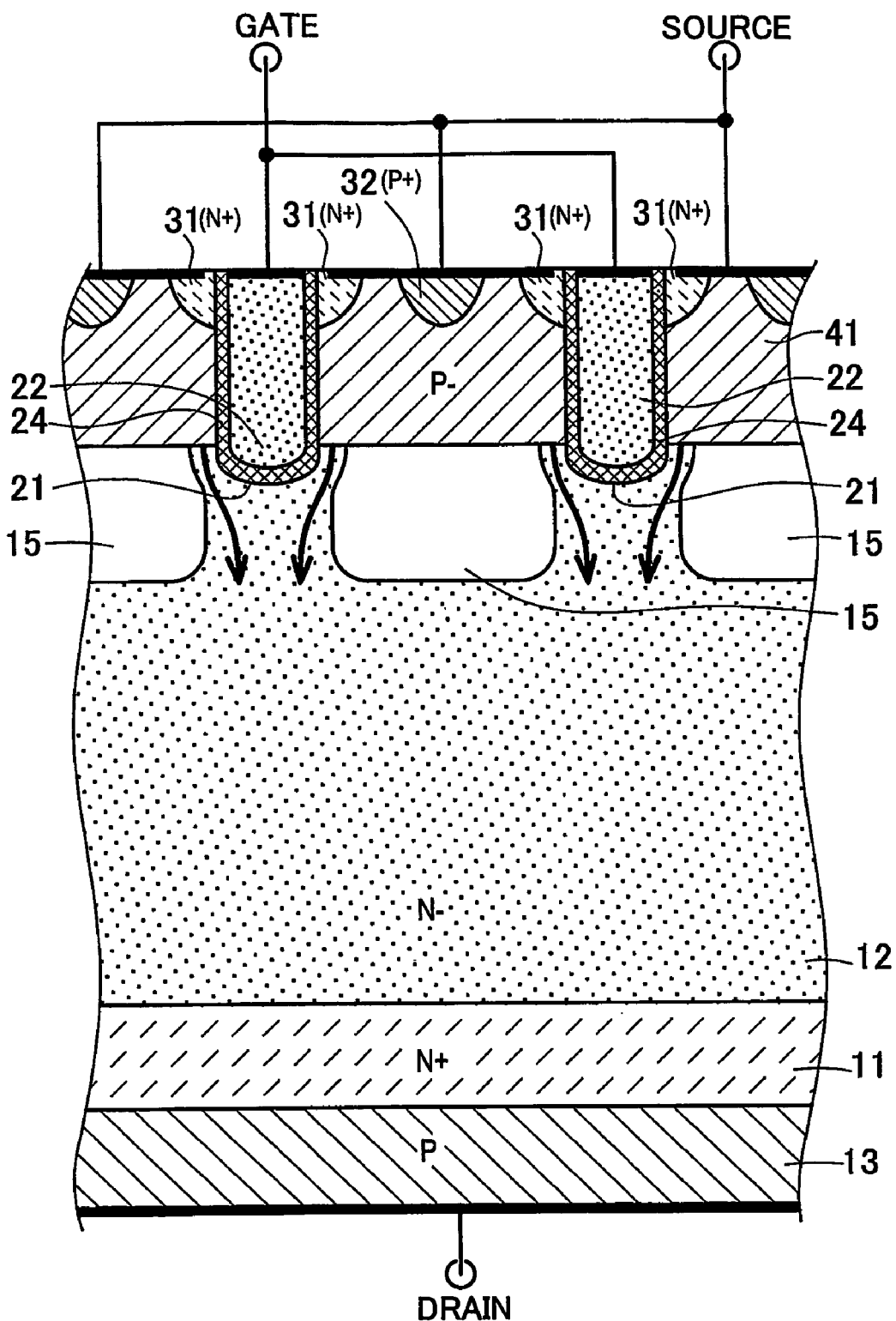
FIG. 26 is a view showing current path in a conventional insulated gate type semiconductor device when load is short-circuited.
Figure 27:
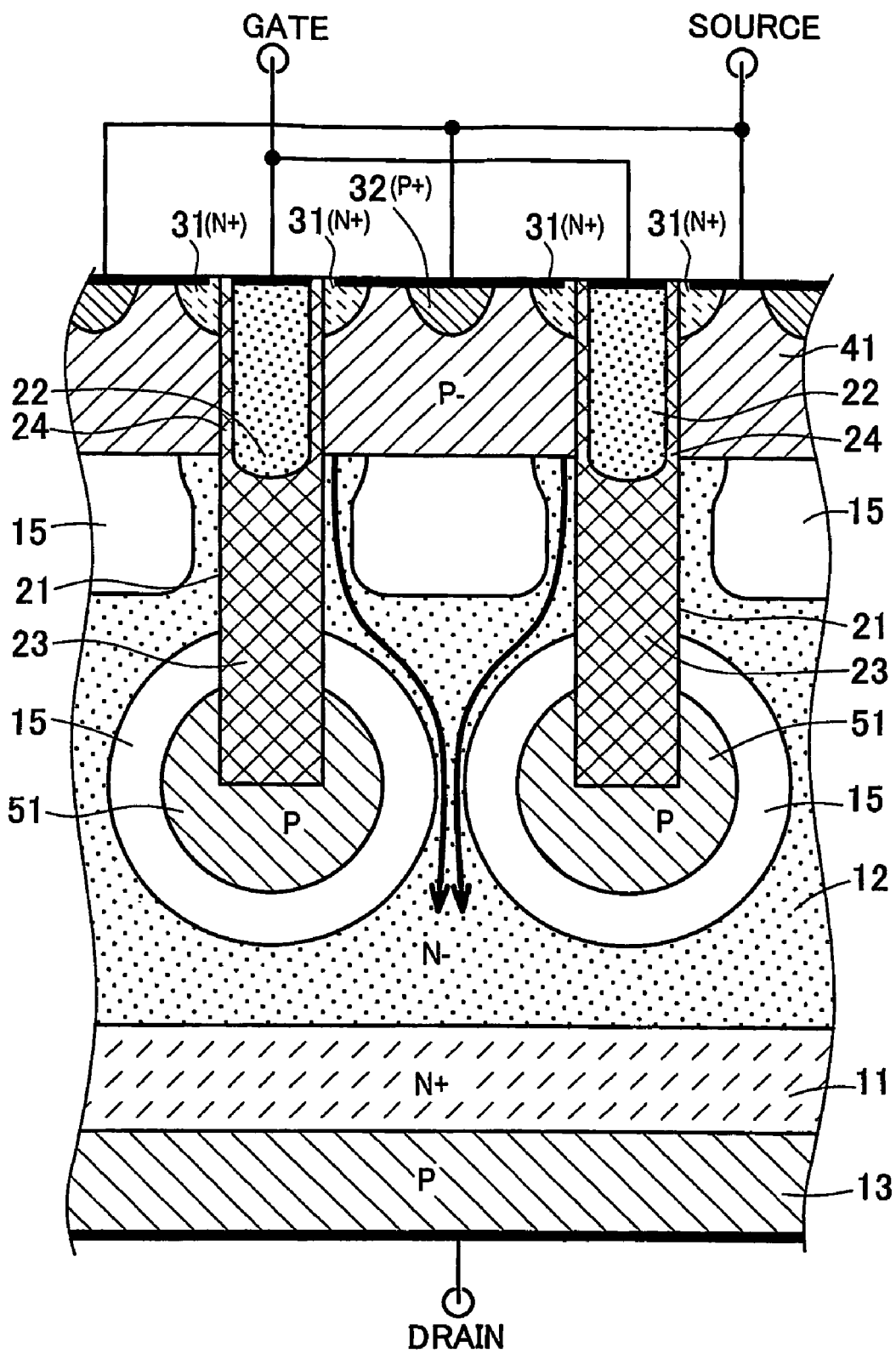
FIG. 27 is a view showing current path in an insulated gate type semiconductor device in the embodiments when load is short-circuited.

Since the depletion layer is formed also from the P floating region 51, the withstand voltage in load short-circuiting is enhanced. That is, in the conventional insulated gate type semiconductor device without P floating region 51, at the time of load short-circuiting, as shown in FIG. 26, depletion layer 15 is formed at the drain side from the PN junction of the P– body region 41 and N– drift region 12, and a current flow in the region beneath the gate trench 21 (see arrow in FIG. 26). On the other hand, in the insulated gate type semiconductor device 100 of the embodiment, the deposited insulating layer 23 is formed beneath the gate electrode 22, and a current flows along the gate trench 21 as shown in FIG. 27. From the P floating region 51, too, a depletion layer 15 is formed. Therefore, the current path in load short-circuiting is very narrow (see arrow in FIG. 27). As a result, the short-circuiting current decreases, and the withstand voltage in load short-circuit is enhanced.

Figure 28:
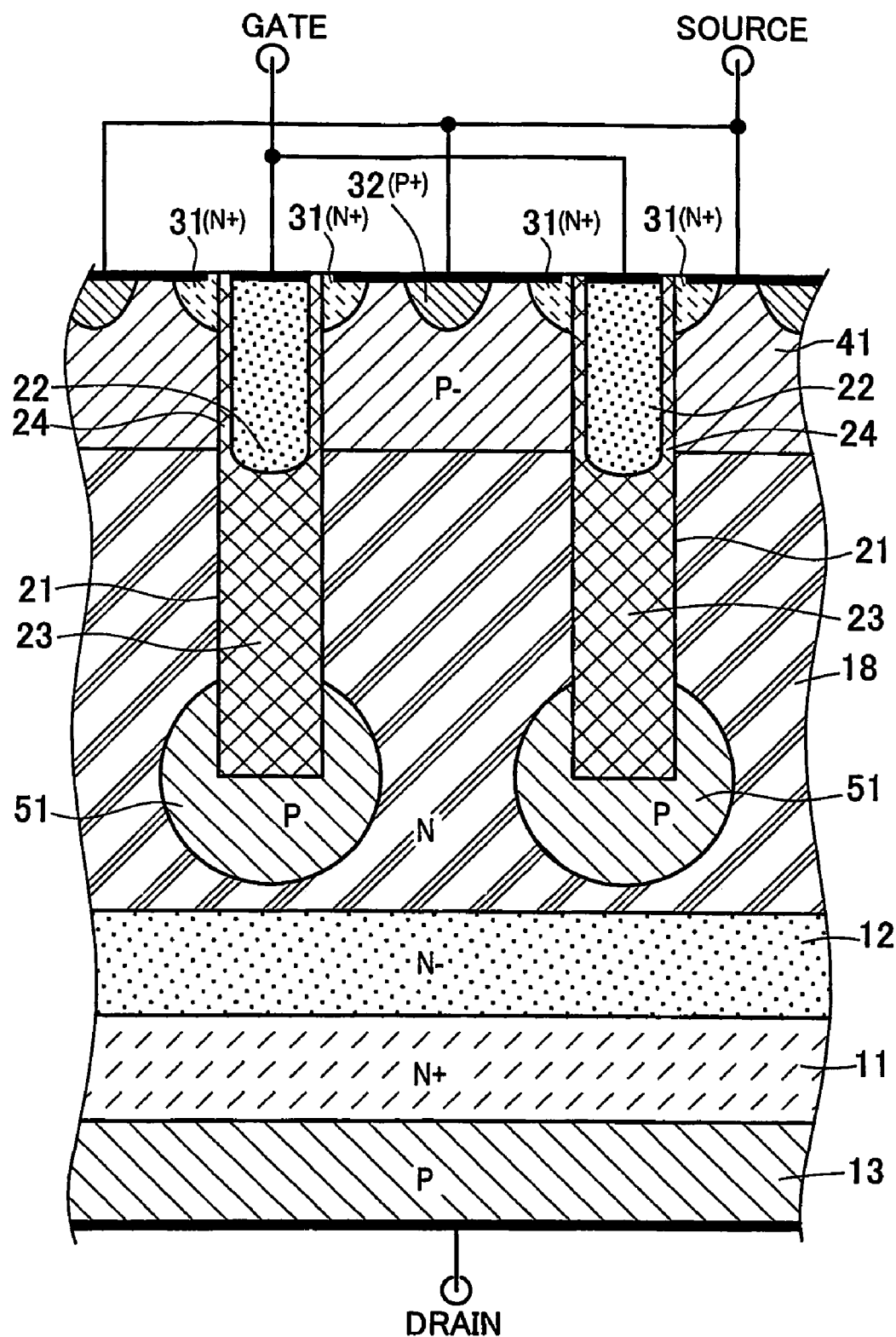
FIG. 28 is a sectional view showing structure (1) of an insulated gate type semiconductor device in which a hole barrier layer is formed.
Figure 29:
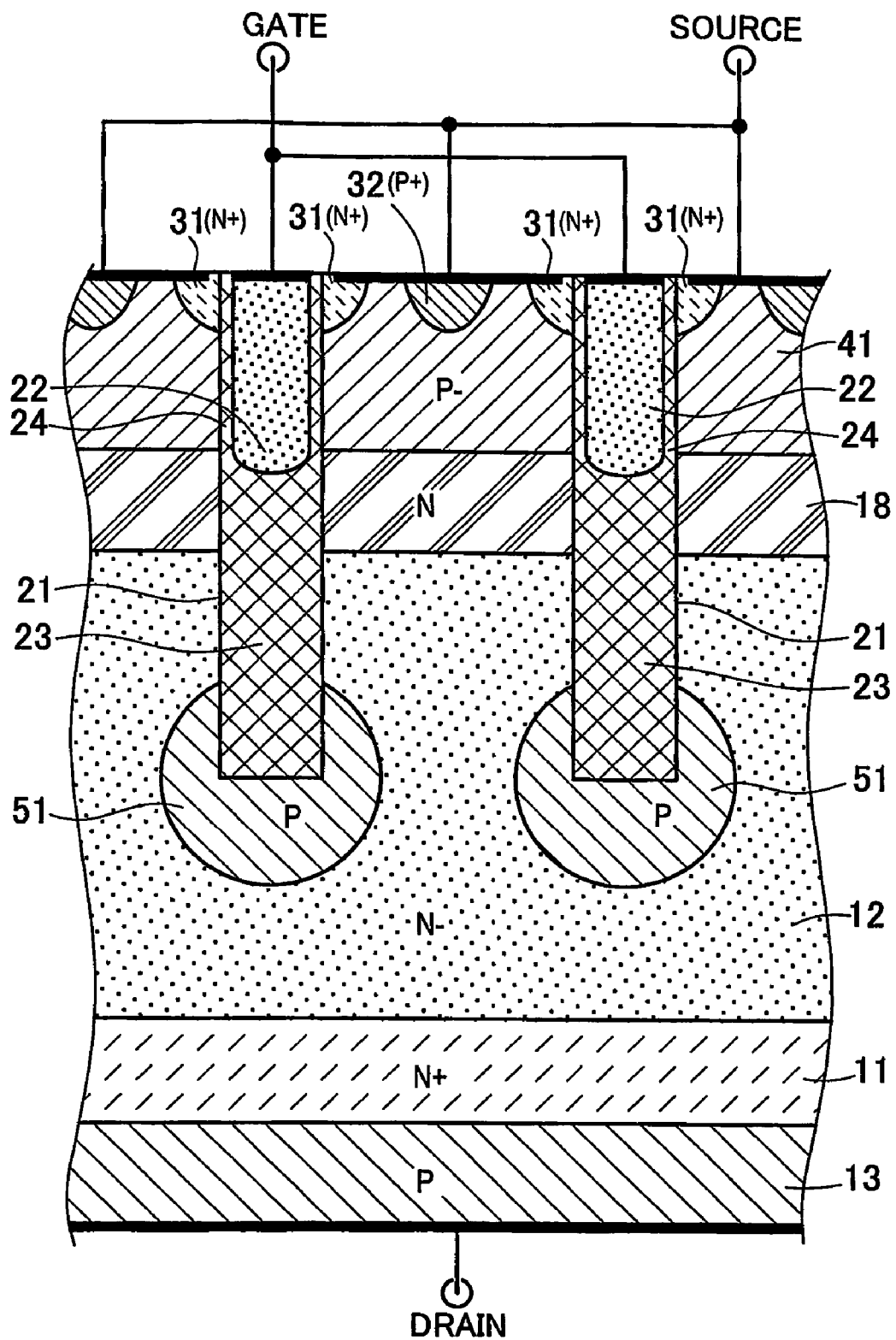
FIG. 29 is a sectional view showing structure (2) of an insulated gate type semiconductor device in which a hole barrier layer is formed.

The invention, as shown in FIG. 28 and FIG. 29, can be also applied to the power MOS forming the N hole barrier region 18 acting as hole barrier between the P– body region 41 and N– drift region 12. In the case of the power MOS forming the N hole barrier region 18, spreading of the depletion layer in the N hole barrier region 18 is narrow. Hence, the withstand voltage may be lowered. However, in the power MOS having the P floating region 51, in addition to the depletion layer formed of the PN junction between the P– body region 41 and N– drift region 12, a depletion layer is also formed from the P floating region 51, so that decline of withstand voltage can be suppressed.

INDUSTRIAL APPLICABILITY

According to the invention, by the floating region surrounded by the drift region, both higher withstand voltage design and lower on-resistance design can be realized. By the deposited insulating layer, effects by implantation of impurity can be avoided. By ion implantation from the bottom of the trench, the floating region can be formed without repeating formation of silicon layer by epitaxial growth. Hence, while realizing both higher withstand voltage design and lower on-resistance design, the insulated gate type semiconductor device that can be manufactured easily and its manufacturing method are presented.

The invention claimed is:

1. An insulated gate type semiconductor device comprising:
a body region arranged at upper surface side in a semiconductor substrate, the body region having a first conductive type semiconductor;
a drift region being in contact with bottom surface of the body region, the drift region having a second conductive type semiconductor; and
a trench section arranged with penetrating the body region from upper surface of the semiconductor substrate and reaching level further below bottom surface of the body region,
wherein the insulated gate type semiconductor further comprises a floating region surrounded by the drift region, the floating region having a first conductive type semiconductor,
bottom of the trench section is arranged in the floating region,
in the trench section, there are formed a deposited insulating layer consisting of deposited insulating material and a gate electrode being arranged above the deposited insulating layer and facing the body region, and
a lower end of the gate electrode is further above top of the floating region,
a space between the bottom surface of the body region and the top of the floating region is wider than a space between a lower end of the deposited insulating layer and a lower end of the floating region, and
a space between the lower end of the gate electrode and the lower end of the deposited insulating layer is wider than a space between the bottom surface of the body region and the top of the floating region,
the space between the adjacent floating regions is a space where positive field intensity distribution curves connect with each other during the off time of the gate electrode voltage, in a middle portion between the floating regions in a direction that connecting the floating regions, the deposited insulating layer having a thickness capable of forming peaks of a electric field at two positions in a direction of thickness of the semiconductor substrate during the off time of the gate electrode voltage.

2. An insulted gate type semiconductor device according to claim 1 further comprising an intermediate floating region arranged further above top of the floating region with being surrounded by the drift region, the intermediate floating region having a first conductive type semiconductor, wherein the trench section penetrates the intermediate floating region, and top of the deposited insulating layer is arranged further above top of the intermediate floating region.

3. An insulated gate type semiconductor device according to claim 1 further comprising:

an auxiliary trench section arranged with penetrating the body region from upper surface of the semiconductor substrate and reaching level further below bottom surface of the body region, the auxiliary trench section being filled with insulating material inside; and an auxiliary floating region surrounded by the drift region, the auxiliary floating region having a first conductive type semiconductor, wherein bottom of the auxiliary trench section is arranged in the auxiliary floating region.

4. An insulated gate type semiconductor device according to claim 3 wherein depth of the trench section and depth of the auxiliary trench section are different.

5. An insulated gate type semiconductor device according to claim 3 wherein depth of the trench section and depth of the auxiliary trench section are same.

6. An insulated gate type semiconductor device according to claim 3, wherein the auxiliary trench section is structure in dot pattern, viewed from top side of the semiconductor substrate.

7. An insulated gate type semiconductor device according to claim 1, wherein in a region around a cell region, there are arranged:
a terminal trench section filed with insulating material inside; and
a terminal floating region surrounded by the drift region, the terminal floating region having a first conductive type semiconductor, and
bottom of the terminal trench section is arranged in the terminal floating region, and
a space between adjoining terminal floating regions is narrower than a space between the bottom surface of the body region and a top of the terminal floating region.

8. An insulated gate type semiconductor device according to claim 1, wherein the lower end of the gate electrode and the bottom surface of the body region are substantially the same in depth.

9. An insulated gate type semiconductor device according to claim 1, wherein the floating region has a nearly circular shape in section, wherein a radius of the floating region is smaller than half the thickness of the deposited insulating layer, and wherein and the first conductive type semiconductor and the second conductive type semiconductor are made of silicon.

10. An insulated gate type semiconductor device comprising:

a body region arranged at upper surface side in a semiconductor substrate, the body region having a first conductive type semiconductor;

a drift region being in contact with bottom surface of the body region, the drift region having a second conductive type semiconductor;

a trench section arranged with penetrating the body region from upper surface of the semiconductor substrate and reaching level further below bottom surface of the body region; and a gate electrode arranged in the trench section with facing the body region, wherein the insulated gate type semiconductor device further comprises:

an auxiliary trench section arranged with penetrating the body region from upper surface of the semiconductor substrate and reaching level further below bottom surface of the body region, the auxiliary trench section being filled with insulating material inside; and an auxiliary floating region surrounded by the drift region, the auxiliary floating region having a first conductive type semiconductor, wherein bottom of the auxiliary trench section is arranged in the auxiliary floating region, and a space between the bottom surface of the body region and the top of the auxiliary floating region is wider than a space between a lower end of the deposited insulating layer and a lower end of the auxiliary floating region, the space between the body region and the floating region is a space where positive field intensity distribution curves connect with each other during the off time of the gate electrode voltage, the deposited insulating layer having a thickness capable of forming peaks of a electric field at two positions in a direction of thickness of the semiconductor substrate during the off time of the gate electrode voltage.

11. An insulated gate type semiconductor device according to claim 10 further comprising an auxiliary intermediate floating region arranged further above top of the auxiliary floating region with being surrounded by the drift region, the auxiliary intermediate floating region having a first conductive type semiconductor, wherein the auxiliary trench section penetrates the auxiliary intermediate floating region, and top of the deposited insulating layer is arranged further above top of the auxiliary intermediate floating region.

12. An insulated gate type semiconductor device according to claim 10 further comprising:

a second auxiliary trench section facing the auxiliary trench section with the gate electrode inserted between there, the second auxiliary trench section being arranged with penetrating the body region from upper surface of the semiconductor substrate and reaching level further below bottom surface of the body region, the second auxiliary trench section being filled with insulating material inside; and a second auxiliary floating region surrounded by the drift region, the second auxiliary floating region having a first conductive type semiconductor, wherein depth of the auxiliary trench section and depth of the second auxiliary trench section are different.

13. An insulated gate type semiconductor device according to claim 10, wherein the auxiliary trench section is structure in dot pattern, viewed from top side of the semiconductor substrate.

14. An insulated gate type semiconductor device according to claim 10, wherein in a region around a cell region, there are arranged:
a terminal trench section filed with insulating material inside; and a terminal floating region surrounded by the drift region, the terminal floating region having a first conductive type semiconductor, and bottom of the terminal trench section is arranged in the terminal floating region, and a space between adjoining terminal floating regions is narrower than a space between the bottom surface of the body region and a top of the terminal floating region.

15. An insulated gate type semiconductor device according to claim 10, wherein the lower end of the gate electrode and the bottom surface of the body region are substantially the same in depth.

16. An insulated gate type semiconductor device according to claim 10, wherein the floating region has a nearly circular shape in section, wherein a radius of the floating region is smaller than half the thickness of the deposited insulating layer, and wherein and the first conductive type semiconductor and the second conductive type semiconductor are made of silicon.

17. Manufacturing method of an insulated gate type semiconductor device which comprises:

a body region arranged at upper surface side in a semiconductor substrate, the body region having a first conductive type semiconductor; a drift region being in contact with bottom surface of the body region, the drift region having a second conductive type semiconductor; a trench section arranged with penetrating the body region from upper surface of the semiconductor substrate and reaching level further below bottom surface of the body region; and a gate electrode arranged in the trench section with facing the body region, the manufacturing method further comprising:

trench section forming step of forming the trench section in the semiconductor substrate on which the drift region and the body regions have been formed;

oxide film forming step of forming an oxide film on a side wall of the trench section formed in the trench section forming step;

impurity injecting step of, after formation of the oxide film in the oxide film forming step, injecting impurity from bottom of a trench section formed in the trench section forming step;

insulating material laying-up step of laying up insulating material in the trench section after impurity is injected through the impurity injecting step; and floating region forming step of forming a floating region by applying thermal diffusion processing after, the insulating material is laid up in the insulating material laying-up step.

18. Manufacturing method of an insulated gate type semiconductor device according to claim 17 further comprising:

trench section drilling step of further drilling down bottom of the trench section after impurity is injected in the impurity injecting step; and impurity re-injecting step of re-injecting impurity from bottom the trench section drilled further in the trench section drilling step.

19. Manufacturing method of an insulated gate type semiconductor device according to claim 17, wherein the trench section is formed in a cell region and a region around the cell region in the trench section forming step, and the insulating material laying-up step comprises:

insulating material filling step of filling inside of the trench section formed in the trench section forming step with insulating material; and deposited material adjusting step of adjusting height of a deposited insulating layer by eliminating a portion of insulating material in the trench section filled with insulating material in the insulating material filling step, particularly, the trench section in the cell region.

20. Manufacturing method of an insulated gate type semiconductor device according to claim 17 further comprising:

etching-back step of removing part of the insulating material by a depth substantially equal to the bottom surface of the body region after the insulating material is laid up in the insulating material laying-up step; and gate material laying-up step of laying up a gate material in a space formed in the trench section in the etching-back step.

* * * * *

UNITED STATES PATENT AND TRADEMARK OFFICE
CERTIFICATE OF CORRECTION

PATENT NO. : 7,470,953 B2  
APPLICATION NO. : 10/573793  
DATED : December 30, 2008  
INVENTOR(S) : Hidefumi Takaya et al.

It is certified that error appears in the above-identified patent and that said Letters Patent is hereby corrected as shown below:

| Column | Line | |
|---|---|---|
| 2 | 24 | Change "is kept being" to --continues to be--. |
| 2 | 43 | Change "process" to --processes--. |
| 3 | 29 | Change "insulted" to --insulated--. |
| 5 | 7 | Change "between there" to --therebetween--. |
| 5 | 18 | Change "pf" to --of--. |
| 5 | 33 | Change "filed" to --filled--. |
| 5 | 44 | After "for" delete "of". |
| 5 | 28 | Change "from bottom the trench" to --from the bottom of the trench--. |
| 8 | 10 | Change "insulate" to --insulated--. |
| 11 | 55 | Before "that" delete "is". |
| 13 | 47 | After "functions" insert --.--. |
| 16 | 46 | Change "body region 41" to --P-body region 41--. |
| 18 | 62 | After "beneath" delete "the". |
| 21 | 4 | Change "a electric" to --an electric--. |
| 21 | 41 | Change "filed" to --filled--. |
| 21 | 60 | After "wherein" delete "and". |
| 22 | 31 | Change "a electric" to --an electric--. |
| 22 | 66 | Change "filed" to --filled--. |
| 23 | 18 | After "wherein" delete "and". |

UNITED STATES PATENT AND TRADEMARK OFFICE
CERTIFICATE OF CORRECTION

PATENT NO. : 7,470,953 B2
APPLICATION NO. : 10/573793
DATED : December 30, 2008
INVENTOR(S) : Hidefumi Takaya et al.

It is certified that error appears in the above-identified patent and that said Letters Patent is hereby corrected as shown below:

| Column | Line | |
|---|---|---|
| 23 | 21 | Change "Manufacturing method" to --A manufacturing method--. |
| 24 | 9 | Change "Manufacturing method" to --The manufacturing method--. |
| 24 | 17 | Change "Manufacturing method" to --The manufacturing method--. |
| 24 | 32 | Change "Manufacturing method" to --The manufacturing method--. |

Signed and Sealed this

Eighth Day of September, 2009

David J. Kappos
*Director of the United States Patent and Trademark Office*